(12) United States Patent
Ryu

(10) Patent No.: US 10,049,429 B2
(45) Date of Patent: Aug. 14, 2018

(54) DEVICE AND METHOD FOR DESIGNING USING SYMBOLIZED IMAGE, AND DEVICE AND METHOD FOR ANALYZING DESIGN TARGET TO WHICH SYMBOLIZED IMAGE IS APPLIED

(71) Applicant: Jung ha Ryu, Gyeonggi-do (KR)

(72) Inventor: Jung ha Ryu, Gyeonggi-do (KR)

(*) Notice: Subject to any disclaimer, the term of this patent is extended or adjusted under 35 U.S.C. 154(b) by 0 days.

(21) Appl. No.: 14/903,655

(22) PCT Filed: Jul. 9, 2014

(86) PCT No.: PCT/KR2014/006140
§ 371 (c)(1),
(2) Date: Jan. 8, 2016

(87) PCT Pub. No.: WO2015/005664
PCT Pub. Date: Jan. 15, 2015

(65) Prior Publication Data
US 2016/0148341 A1    May 26, 2016

(30) Foreign Application Priority Data

Jul. 9, 2013  (KR) .................. 10-2013-0080573
Jul. 9, 2013  (KR) .................. 10-2013-0080574

(51) Int. Cl.
*G06T 3/00*   (2006.01)
*G06F 17/50*  (2006.01)

(52) U.S. Cl.
CPC ............ *G06T 3/0056* (2013.01); *G06F 17/50* (2013.01); *G06T 3/0012* (2013.01); *G06T 2200/28* (2013.01)

(58) Field of Classification Search
None
See application file for complete search history.

(56) References Cited

U.S. PATENT DOCUMENTS

| 5,119,441 A | 6/1992 | Wang et al. |
| 2002/0062264 A1* | 5/2002 | Knight ................. G06Q 10/087 705/26.1 |
| 2011/0295829 A1 | 12/2011 | Boncyk et al. |
| 2012/0105454 A1* | 5/2012 | Gonzalez .............. G06F 17/214 345/467 |
| 2012/0259738 A1 | 10/2012 | Pillai |

FOREIGN PATENT DOCUMENTS

| JP | 2005004543 A | 1/2005 |
| KR | 1020040102038 A | 12/2004 |

* cited by examiner

*Primary Examiner* — Edward Martello
(74) *Attorney, Agent, or Firm* — Husch Blackwell LLP

(57) ABSTRACT

A first method for mapping out a design by using a symbolized image and a second method for analyzing an object of design to which a symbolized image is applied is provided. The first method includes the steps of: mapping out an object of design to display the symbolized image including a symbolic sign created at a position in the symbolized image corresponding to a blank space of a character image; and outputting an image of the object of design. Further, the second method includes the steps of: receiving information on an appearance of the object of design implemented by using a symbolized image including a symbolic sign created at a position in the symbolized image corresponding to a blank space of the character image; extracting the symbolized image implemented on the object of design; and (c) displaying the extracted symbolized image.

26 Claims, 34 Drawing Sheets

(a) (b) (c) (d) (e) (f) (g) (h) (i) (j)

INPUT NUMERALS AUTOMATICALLY

COMPLETE THE OBJECT OF DESIGN (a)  (b)  (c)

DEVICE AND METHOD FOR DESIGNING USING SYMBOLIZED IMAGE, AND DEVICE AND METHOD FOR ANALYZING DESIGN TARGET TO WHICH SYMBOLIZED IMAGE IS APPLIED

CROSS REFERENCE TO RELATED APPLICATIONS

This application is a U.S. National Phase Application of International Application PCT Application No. PCT/KR2014/006140 filed on Jul. 9, 2014, which claims the benefit of priority from Korean Patent Applications 10-2013-0080573 and 10-2013-0080574 each filed on Jul. 9, 2013. The disclosures of International Application PCT Application No. PCT/KR2014/006140 and Korean Patent Applications 10-2013-0080573 and 10-2013-0080574 are incorporated herein by reference.

FIELD OF THE INVENTION

The present invention relates to a device and a method for designing using symbolized image, and a device and a method for analyzing an object of design to which the symbolized images are applied; and more particularly, to the device and the method for mapping out designs of various industrial products such as products, works of art, structures, handcrafts, buildings, etc. by using symbolized images, e.g., images of symbolized characters such as Korean characters, English characters, and numerals, and the device and the method for analyzing the object of design to which the symbolized images are applied.

BACKGROUND OF THE INVENTION

In modern times, thanks to the development of image media, the importance of delivery of information on images other than characters has been increased. For example, in relation to famine relief and refugee rescue, images that are combined with characters or numerals compared to a long-winded appeal expressed only in characters or numerals are more appealing. Studies on how to symbolically imply the meanings of the languages and how to increase utilization industrially are researched by reflecting this trend.

Particularly, studies are required to increase awareness of language and enhancing industrial applications by symbolically expressing characters or numerals of a language on industrial products such as products, works of art, structures, handcrafts, buildings, etc. in a variety of fields including the fields of industry, art, design, architecture, handcraft, and urban planning. Also required are solutions for mapping out designs that help industrial products to which symbolized images symbolizing Korean characters, English characters and numerals can be applied be easily mapped out.

Additionally, design analyzing and interpreting solutions have come to be necessary to explain to the public easily what kind of symbolized images are implemented specifically in the industrial products.

SUMMARY OF THE INVENTION

It is an object of the present invention to provide a device and a method for mapping out designs of various industrial products such as products, works of art, structures, handcrafts, buildings, etc. by using symbolized images and a device and a method for analyzing an object of design to which symbolized images are applied.

In accordance with one example embodiment of the present invention, there is provided a method for mapping out a design by using a symbolized image; including the steps of: (a) mapping out an object of design to display the symbolized image, as an image corresponding to a character image, including a symbolic sign created at a position in the symbolized image corresponding to a blank space of the character image; and (b) outputting an image of the object of design with the symbolized image.

The character includes at least one of Korean characters, English characters, and numerals.

The symbolic sign is determined depending on shape of the blank space of the character or numeral image.

The symbolic sign is in shape of triangle, square, circle, or any other shapes.

At the step of (a), the structure of the object of design is designed depending on the shape of the symbolic sign.

At the step of (a), wherein the external surface of the object of design is designed depending on the shape of the symbolic sign.

In accordance with one example embodiment of the present invention, there is provided a device for mapping out a design by using a symbolized image, including: a design processing part for mapping out an object of design to display the symbolized image, as an image corresponding to a character image, including a symbolic sign created at a position in the symbolized image corresponding to a blank space of the character image; and an output part for outputting an image of the object of design mapped out by the design processing part.

The character includes at least one of Korean characters, English characters, and numerals.

The symbolic sign is determined depending on the shape of the blank space of the character or number image.

The symbolic sign is in shape of triangle, square, circle, or any other shapes.

The design processing part designs the structure of the object of design depending on the shape of the symbolic sign.

The design processing part designs the external surface of the object of design depending on the shape of the symbolic sign.

In accordance with one example embodiment of the present invention, there is provided a method for analyzing an object of design to which a symbolized image is applied, including the steps of: (a) receiving information on an appearance of the object of design implemented by using a symbolized image, as an image corresponding to a character image, including a symbolic sign created at a position in the symbolized image corresponding to a blank space of the character image; (b) extracting the symbolized image implemented on the object of design by analyzing the information on the appearance of the object of design; and (c) displaying the extracted symbolized image.

The symbolized image is an overlapped image of multiple symbolic signs and, at the step of (b), the multiple individual symbolic signs are extracted.

Reference coordinates for interpreting the symbolized images are displayed on the symbolized images.

The character includes at least one of Korean characters, English characters, and numerals.

The symbolic sign is determined depending on the shapes of blank spaces of the character images or number images.

The symbolic sign is in shape of triangle, square, circle, or any other shapes.

The information on the appearance is one piece of information among the image information, lighting information, temperature information, and frequency information of the object of design.

In accordance with one example embodiment of the present invention, there is provided a device for analyzing an object of design to which a symbolized image is applied, including: an input part for receiving information on the appearance the object of design implemented by using a symbolized image, as an image corresponding to a character image, including a symbolic sign created at a position in the symbolized image corresponding to a blank space of the character image; an analysis part for extracting the symbolized image implemented on the object of design by analyzing the information on the appearance inputted through the input part; and a display part for displaying the symbolized image extracted by the analysis part.

The symbolized image is an overlapped image of multiple symbolic signs and the analysis part extracts the multiple individual symbolic signs.

The reference coordinates for interpreting the symbolized images are displayed on the symbolized images.

The character includes at least one of Korean characters, English characters, and numerals.

The symbolic sign is determined depending on the shapes of blank spaces of the character or number images.

The symbolic sign is a shape of triangle, square, circle, or other shapes.

The information on the appearance is one piece of information among the image information, lighting information, temperature information and frequency information of the object of design.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

In the following detailed description, reference is made to the accompanying drawings. It must be noted that the same components among drawings must be represented with the same signs at any place, if possible. In addition, detailed explanation on notice functions and configurations that may unnecessarily fuzz up the gist of the present invention will be omitted.

In accordance with one example embodiment of the present invention, a symbolized image that symbolizes a Korean character includes at least one symbolic sign in a part or parts of a space divided (space division) from a certain blocked space (e.g., a square whole image frame).

In the meantime, no symbolic sign may not be determined with respect to some characters (e.g., "—," "|," or "⊣" as Korean vowels, "l" as English lowercase character, numeral "1," etc.).

Besides, a symbolized image symbolically describing an English character or a numeral that corresponds to the English character or the numeral includes at least one symbolic sign in a part or parts of a space divided (space division) from a certain divided space (e.g., a square whole image frame) where the symbolic sign is simplified into a dot, a line or a plane from a shape determined by blank space (margin) in a specific frame if a character of a language (such as Korean, English, etc.) or a numeral is assumed to be included in the specific frame. Herein, the dot may have triangle, square, circle, or other various shapes.

Figure 1:
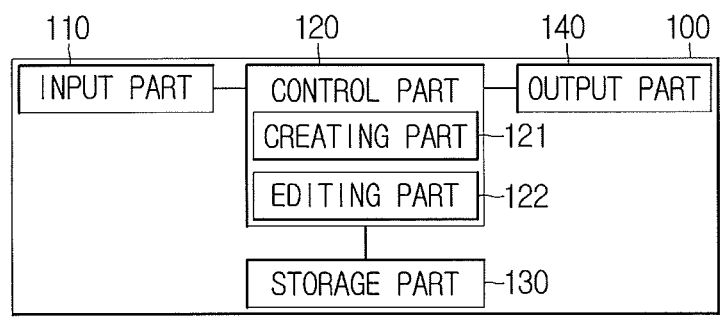
FIG. 1 is a diagram illustrating a configuration of a device for editing a symbolized image in accordance with the present invention.

FIG. 1 is a diagram illustrating a configuration of a device for editing a symbolized image in accordance with the present invention. By referring to FIG. 1, a device 100 for editing a symbolized image includes an input part 110, a control part 120, a storage part 130, and an output part 140. The device 100 for editing a symbolized image in the present invention may be operated by itself (as shown in a first example embodiment below) or communicate with other external devices (as devices like the devices 100) through a data communication network (as shown in second and third example embodiments below). The data communication network may be a wired or a wireless telephone network, the Internet, a Bluetooth network, etc. The communication terminal may be a digital device that allows data communication and may be a wired or a cordless telephone, a SIP terminal, a cellular phone, a PDA, a normal PC, a handheld PC, a laptop equipped with a wired/wireless modem, smart glasses, a smart camera, a smart watch, a black box, a navigation system, a camera, or an image recorder.

As the first example embodiment, the device 100 for editing a symbolized image transforms a character (including a numeral) of a language (including, but not limited to, Korean or English) inputted through the input part 110 into a symbolized image, and prints in real time through the output part 140. In addition, the device 100 for editing a symbolized image may also interpret the symbolized image inputted through the input part 110 and then prints a corresponding character (including the numeral) of the language in real time through the output part 140. In other words, in the first example embodiment, both input and output processes are performed in the device 100 for editing a symbolized image.

As the second example embodiment, the device 100 for editing a symbolized image delivers information on a character (including a numeral) of a language (including, but not limited to, Korean or English) through the input part 110 to an external device. Besides, the device 100 for editing a symbolized image may also interpret the symbolized image inputted through the input part 110 and delivers the information on the character (including the numeral) of the language (including, but not limited to, Korean or English) to the external device. In other words, in the second example embodiment, an input process is performed in the device 100 for editing a symbolized image and an output process is performed through the external device.

As the third example embodiment, the device 100 for editing a symbolized image transforms a character (including a numeral) of a language (including, but not limited to, Korean or English) delivered from an external device into a symbolized image and prints in real time through the output part 140. At the time, the external device delivers the information on the character (including the numeral) of the language (including, but not limited to, Korean or English) through the input part 110 to the device 100 for editing a symbolized image or interprets the symbolized image inputted through the input part 110 and then delivers information on the character (including the numeral) of the language to the device 100 for editing a symbolized image. In short, in the third example embodiment, an input process is performed through the external device and an output process is performed in the device 100 for editing a symbolized image.

As a fourth example embodiment, the input process might be performed through an external device and the output process might not be performed through the device 100 but through another external device.

In the second and the third example embodiments, the external device, like the device 100, is equipped in, or connected to, a communication terminal to be operated and it communicates with the device 100 through a data communication network.

A symbolized image is created at a position corresponding to that of a blank space of a character or number image and is determined depending on the shape of the blank space of the character or number image.

Particularly, a symbolized image corresponding to a Korean character describes the Korean character symbolically and it includes a symbolic sign which is placed on part of divided spaces where at least one Korean character is described to classify a Korean initial consonant, a vowel, and a final consonant. Moreover, a symbolized image corresponding to an English character or a numeral describes the English character or the numeral symbolically and it includes a symbolic sign which is placed on part of divided spaces where at least one English character or numeral is described. At the time, a line for space division may be visually described or omitted depending on the intention of a performer and a reference coordinate may be marked if it is difficult to interpret the symbolized image without any space division line.

As the input/output processes of external devices are same as those of the device 100 for editing a symbolized image in accordance with the first example embodiment, explanation will be described below in center of the first example embodiment.

The control part 120 performs a role of transforming information on characters of languages (including, but not limited to, Korean or English) (including numerals) inputted from the input part 110 in accordance with the first example embodiment or delivered from the external device in accordance with the third example embodiment and then displaying, transmitting, or printing through a printer, the information through the output part 140. The control part 120 includes a creating part 121 and an editing part 122.

In accordance with one example embodiment, the creating part 121 creates a symbolized image at a position corresponding to the blank space of a character/number image acquired by using information on the character of the language or the numeral inputted through the input part 110 to thereby display it on the display screen of the output part 140 or print it to a printer. The created symbolized image is stored in the storage part 130.

Upon the execution of the present invention, while corresponding relations between respective symbolized images and respective characters/numerals are stored in the storage part 130, the creating part 121 may extract a symbolized image that is mapped to a character/numeral inputted by a user and stored in the storage part 130 in real time and then display on a display screen of the output part 140 or print it to a printer as well.

In accordance with another example embodiment, the creating part 121 may interpret a symbolized image inputted through the input part 110 and extract a character/numeral mapped to the symbolized image stored in the storage part 130 in real time and then print the character of the language/the numeral through the output part 140.

When a user inputs an editing command for adjusting the size, color, shape, transparency, position, etc. of a symbolized image displayed on the display screen of the output part 140 or transforming it into another image or character through the input part 110, the editing part 122 performs a function of editing the symbolized image depending on the editing command (an image editing function during the output process). Furthermore, the editing part 122 may edit and configure freely a space, where the symbolized image is expressed (e.g., a square whole image frame), and a state of space division (e.g., a state of space division to classify a Korean initial consonant, a vowel, and a final consonant). It may be called as a function of editing space during the input/output processes.

In accordance with one example embodiment, the input part 110 is used to input information on a character of a language or a numeral which a user wants to output as a symbolized image (including displaying or printing through a printer, etc.) and also used to input a command for editing the symbolized image created by the user.

In accordance with another example embodiment, the input part 110 is used to input a symbolized image which a user wants to output as a character of a language or a numeral (such as displaying, transmitting, or printing through the printer) and also used to input a command for editing the symbolized image inputted by the user.

In accordance with still another example embodiment, the input part 110 is used to input an editing command for a space, where a symbolized image the user wants can be expressed (e.g., a square whole image frame), and a state of space division (e.g., space division to classify a Korean initial consonant, a vowel, and a final consonant).

The input part 110 may include a keypad, a touch screen, a mouse pad, a mouse, an optical pen mouse, etc. Of course, it is possible to input a character or a numeral inputted through the GUI on a touch screen by using a keypad or also on a keypad by using a touch screen. The subjects of application in the present invention may be a device with a keypad only, one with a touch screen only, or one with both.

A keypad includes multiple key buttons to input numerals and characters or special characters. Besides, it has a function button and normal button, additionally, for storing, modifying, or importing inputted characters/numerals and it performs a function of a medium that transmits a user's direction to the control part 120. When a user puts some pressure on a character key (a consonant, or a vowel) or a num lock key (or puts micro-current or makes a sensor detect the user's motion) by using his or her hands, etc., data required to recognize the corresponding character or number, i.e., key data, is generated and then transmitted to the control part 120, which checks character/numeral code data corresponding to the key data in the storage part 130 and extracts a symbolized image mapped to the character/numeral code data and then displays or transmits it on the output part 140 or prints it to a printer. Because a configuration of hard keys of the keypad to input characters or numerals and a method for recognizing and combining the characters or numerals by using the keypad may be configured by applying the prior art, detailed explanation on these will be omitted.

In addition, when the user puts some pressure on a character key (a consonant, or a vowel) or a num lock key on the upper side of the panel of a touch screen by using his or her hand or a writing material such as a stylus pen, the touch screen as a means of object-oriented character/numeral information generates data required to recognize the corresponding character or number, i.e., touch screen data, and sends the data to the control part 120 and the control part 120 checks character/numeral code data corresponding to the authorized touch screen data in the storage part 130 and extracts a symbolized image mapped to the character/numeral code data and then displays or transmits it on the output part 140 or prints it to a printer. Because a configuration of soft keys of the touch screen to input characters or numerals and a method for recognizing and combining the characters or numerals by using the touch screen may be configured by applying the prior art, detailed explanation on these will be omitted.

The storage part 130 stores programs to drive a function processed by the control part 120 or implement user convenience and several basic functions, etc. For example, it may be implemented as volatile memory such as RAM or non-volatile memory such as flash memory and a program to comprehensively control the overall operation of a device, operation programs to process data inputted from the input part 110, etc. are stored therein. In particular, the storage part 130 has character/numeral code data corresponding to key data or touch screen data and symbolized images mapped thereto. The symbolized images mapped to character/numeral code data will be explained later.

The output part 140 performs an action of displaying or printing through a printer under the control of the control part 120. In accordance with one example embodiment, information on the symbolized image outputted by the output part 140 corresponds to information on characters/numerals inputted through the input part 110. In other words, when the user inputs a character/numeral, the corresponding character/numeral code data may be extracted and a symbolized image mapped thereto may be outputted and then displayed on the display screen of the output part 140 or printed through the printer. In accordance with another example embodiment, information on the character/numeral outputted to the output part 140 corresponds to information on the symbolized image inputted through the input part 110. In brief, when a user inputs a symbolized image, the corresponding character/numeral code data is extracted and the symbolized image mapped thereto is printed and then displayed on the display screen of the output part 140 or printed through the printer.

For example, since it is possible to express with a total of 19 Korean initial consonants in the Korean input mode, fourteen single consonants ("ㄱ," "ㄴ," "ㄷ," "ㄹ," "ㅁ," "ㅂ," "ㅅ," "ㅇ," "ㅈ," "ㅊ," "ㅋ," "ㅌ," "ㅍ," and "ㅎ") and five double consonants ("ㄲ," "ㄸ," "ㅃ," "ㅆ," and "ㅉ,") as initial consonants are enough. Besides, since it is possible to express with a total of 21 Korean vowels, ten single vowels "ㅏ," "ㅓ," "ㅗ," "ㅜ," "ㅡ," "ㅣ," "ㅐ," "ㅔ," "ㅚ," and "ㅟ,") and eleven complex vowels ("ㅑ," "ㅕ," "ㅛ," "ㅠ," "ㅒ," "ㅖ," "ㅘ," "ㅙ," "ㅝ," "ㅞ," "ㅢ," and "ㅟ,") are enough as vowels. Moreover, since it is possible to express with a total of 27 final consonants, fourteen single consonants, two double consonants, and eleven consonant blends ("ㄳ," "ㄵ," "ㄶ," "ㄺ," "ㄻ," "ㄼ," "ㄽ," "ㄾ," "ㄿ," "ㅀ," and "ㅄ,") as final consonants are enough.

As such, the device 100 for editing a symbolized image interprets a character (including a numeral) of a language (including, but not limited to, Korean or English) as a symbolized image and outputs it as the character (including a numeral) of the corresponding language. As explained above, the symbolized image that corresponds to a Korean character, may be an image for expressing a character of a language or a numeral symbolically. In detail, it may include at least one symbolic sign that is placed on part of a space divided (space division) from a certain space (e.g., a square whole image frame). The symbolic sign is acquired by simplifying a shape identified from blank space (margin) into a dot, line or plane. Herein, the shape identified from the blank space may be acquired by putting a character of a language (including, but not limited to, Korean or English) or a numeral into a specific frame. Further, the dot may have triangle, square, circle, or other various shapes.

Figure 28:
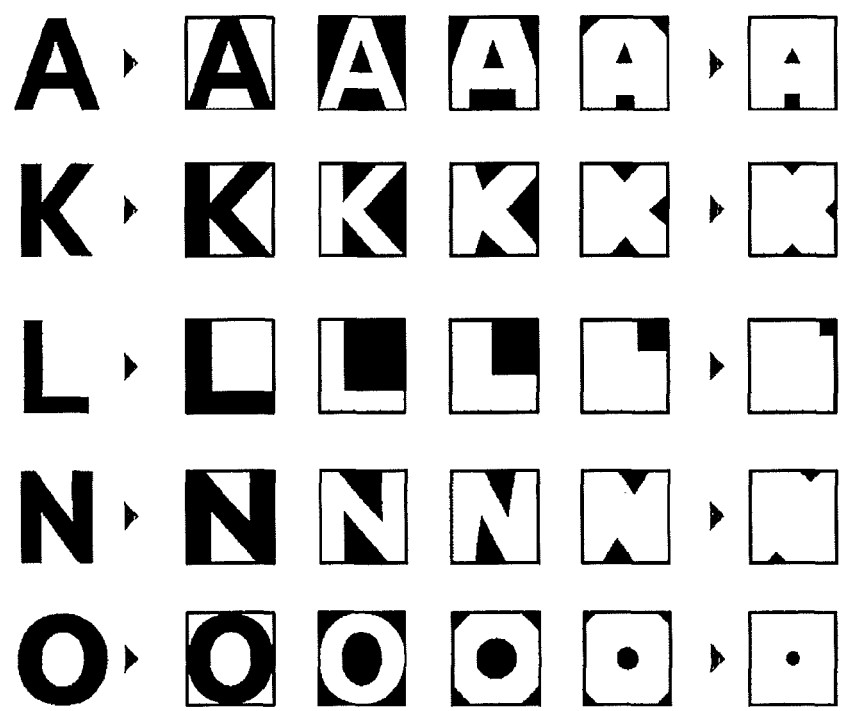

A symbolized image that symbolizes a character of a language or a numeral may consider the character of the language or the numeral not as a flat-panel object used for printing but as an object with mass and volume and it is based on character/numeral processing technology that processes casting obtained by pouring molten metal into an empty space in a specified mold and expresses characters and numerals simply and symbolically with the original frameworks. The process of processing characters or numbers was exemplified in a plane in FIG. 2 (in case of Korean characters) and FIG. 28 (in case of English alphabet characters). In brief, a concept of space is granted to express a character of a language or a numeral and it is expressed in a simplified space. The character of the language or the numeral is processed and simplified to extract a symbolic sign that can be expressed as triangle, square, circle, etc. Then, the symbolic sign is placed on a space to express the character of the language or the numeral symbolically.

Accordingly, a Korean symbolized image displayed on the display screen of the output part 140 is expressed in use of a first space where at least one Korean character (at least one syllable) is expressed, space division that may express Korean symbolically by performing one of functions among initial consonants, vowels, and final consonants in second spaces divided from the first space (split into second spaces) by a dot, line, plane or other marks, and a symbolic sign among a triangle, a square, a circle, and a straight line placed on the second spaces. Herein, the respective second spaces could be comprised of spaces in horizontal, vertical, or combined direction and the first space may be placed leaving an interval in vertical or horizontal direction. In addition, the symbolic sign may be at least one of objects in shape of triangle, square, circle, or any other figures or objects and images configured to have such shape or a shape, or characters that suggest the respective figures.

Figure 3:
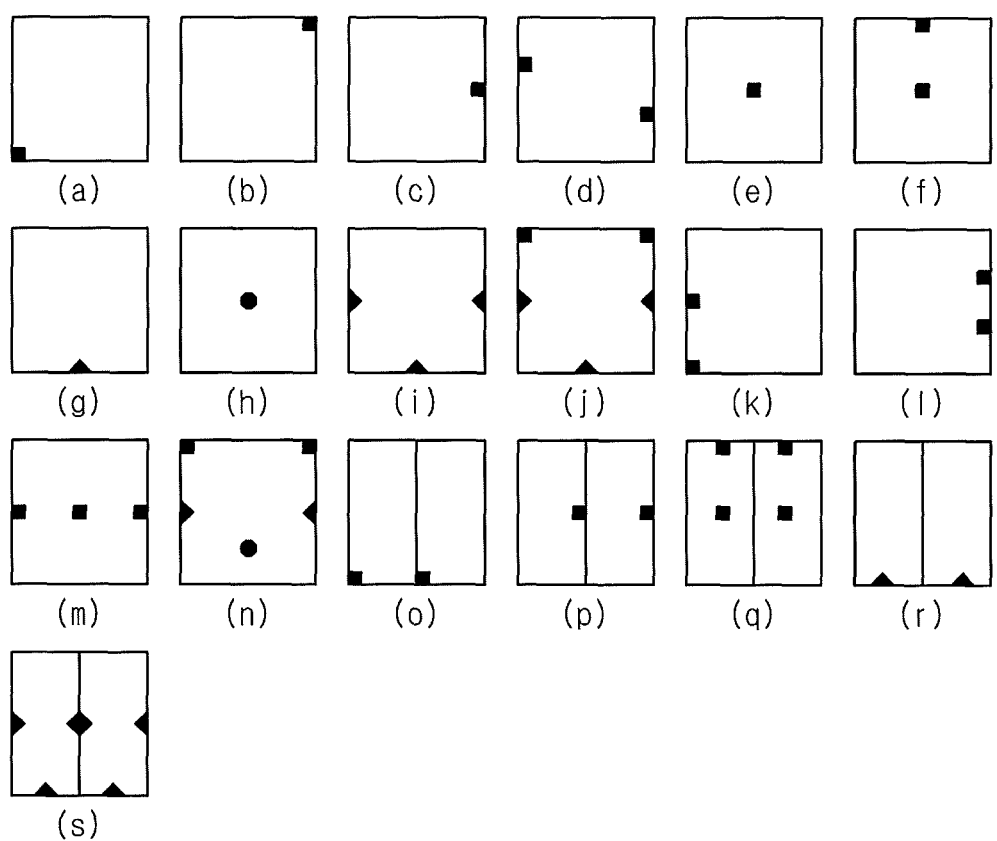
FIG. 3 is a diagram showing a principle of creating symbolized images corresponding to Korean initial consonants in accordance with one example embodiment of the present invention.
Figure 4:
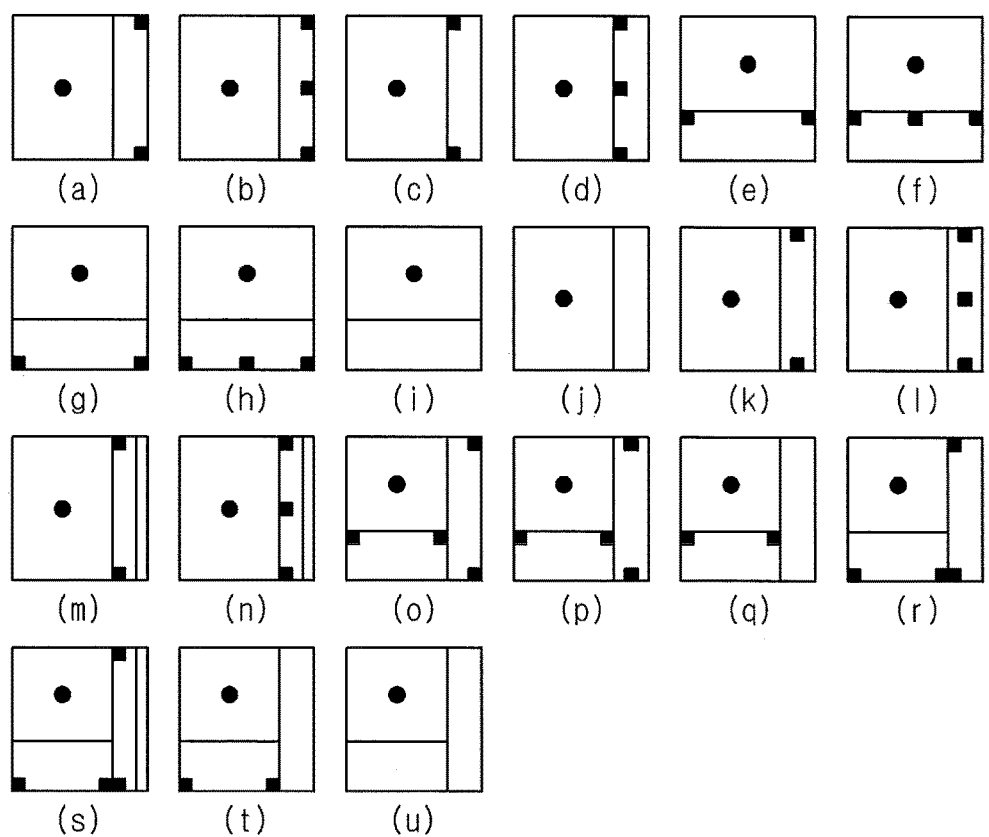
FIG. 4 is a diagram representing a principle of creating symbolized images corresponding to Korean vowels in accordance with one example embodiment of the present invention.
Figure 5:
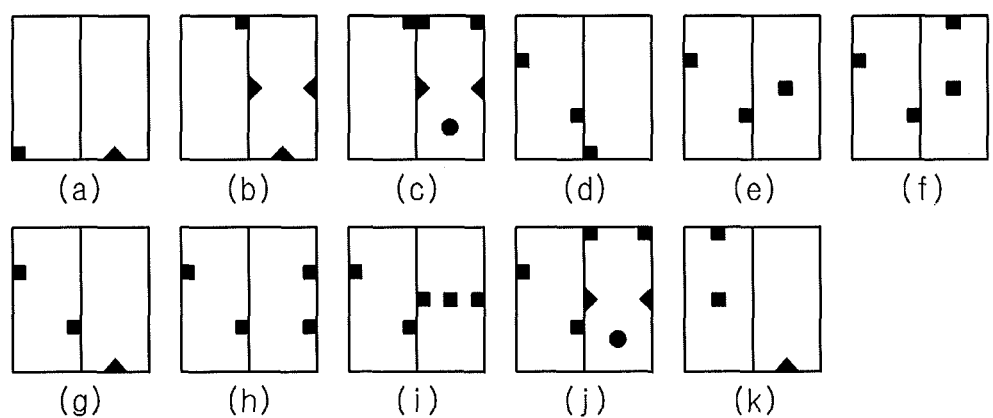
FIG. 5 is a diagram showing a principle of creating symbolized images corresponding to Korean final consonants in accordance with one example embodiment of the present invention.
Figure 6:
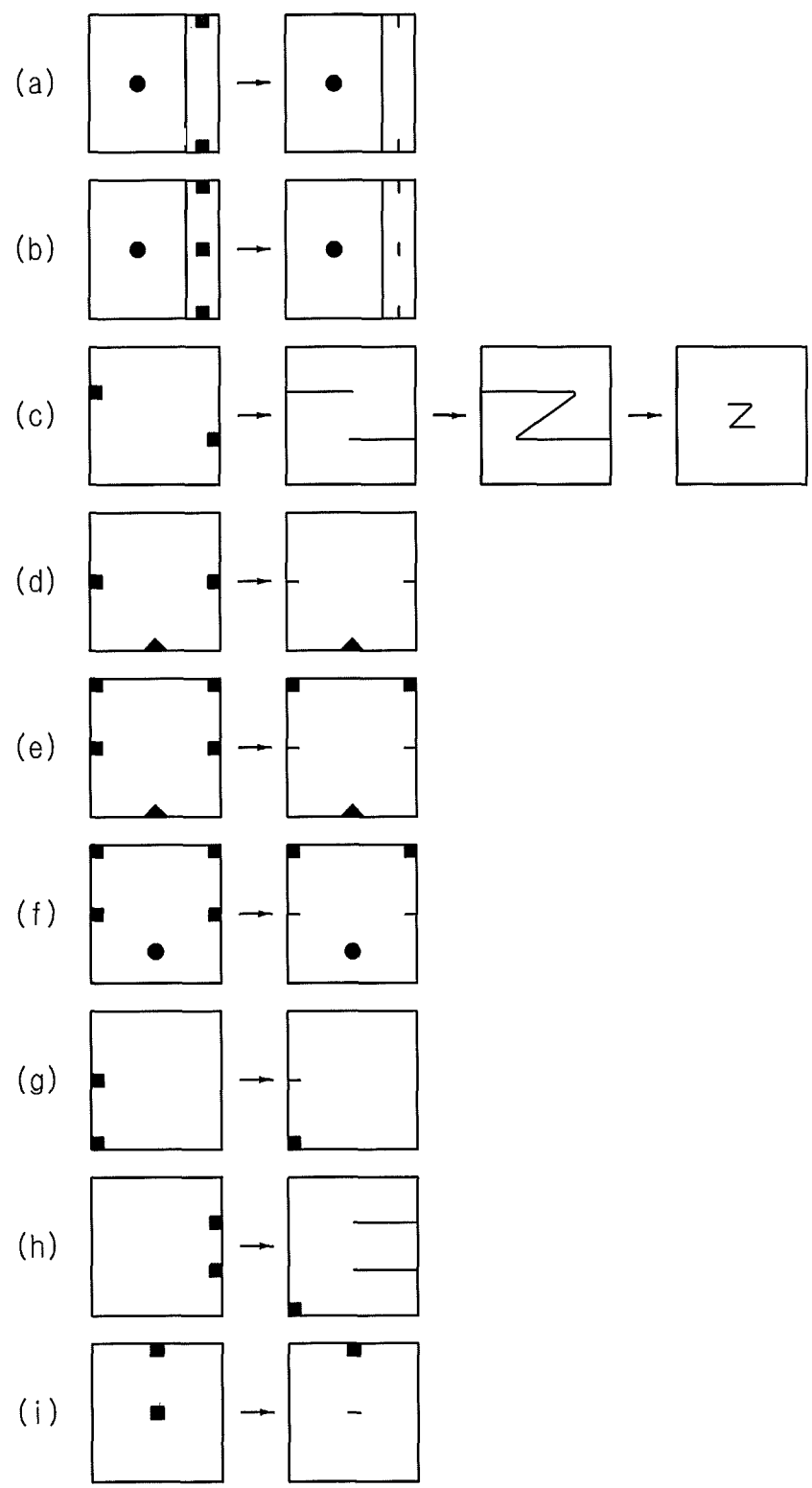
FIG. 6 is a drawing showing a principle of transforming symbolized images in accordance with one example embodiment of the present invention.
Figure 7:
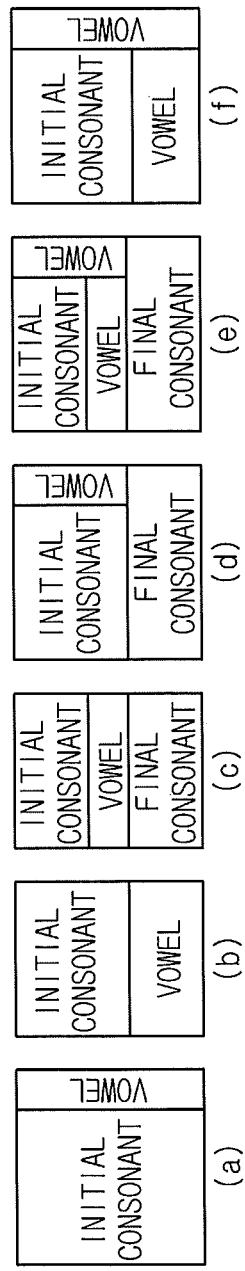
FIG. 7 is a drawing explaining areas on which respective symbolized images of Korean initial consonants, vowels, and final consonants are created in accordance with one example embodiment of the present invention.

In accordance with one example embodiment, a principle of creating symbolized images of Korean characters is as follows:

FIGS. 3 through 5 are drawings that show the principles of creating symbolized images corresponding to Korean characters in accordance with one example embodiment of the present invention and FIG. 6 exemplifies drawings of Korean initial consonants, vowels, and final consonants by using dots, lines, and planes. FIG. 7 illustrates drawings of a Korean initial consonant, a vowel, and a final consonant by space division. As explained above, space division, for example, means space partition to divide a Korean initial consonant, a vowel, and a final consonant.

First of all, FIG. 3 shows a principle of creating symbolized images corresponding to Korean initial consonants. Specifically, (a) shows a square symbolized image created on the bottom of the left, i.e., a blank position of "ㄱ", while (b) shows a square symbolized image created on the top of the right, i.e., a blank position of "ㄴ", and (c) shows a square symbolized image created at the right center, i.e., a blank position of "ㄷ".

Besides, (d) illustrates square symbolized images in the same shapes as those of blank spaces of "ㄹ" created at the blank positions and (e) shows a square symbolized image created in the same shape as that of a blank space of "ㅁ" at the center. In addition, (f) shows square symbolized images created in the same shapes as the those of blank spaces of "ㅂ" at the center and the center top as blank positions and (g) illustrates a triangle symbolized image created in the same shape as that of a blank space of "ㅅ" at center bottom as a blank position. Moreover, (h) shows a round symbolized image in the same shape as that of a blank space of "ㅇ" at the center as a blank position.

For reference, the symbolized images in the same shapes as those of the blank spaces at positions corresponding to those of the blank spaces are created in this specification. However, and symbolized images with as different shapes as blank spaces at blank spaces on the images of individual Korean characters could be also created because positions of the blank spaces may decide unique characteristics of characters.

In accordance with the rules explained above, when the other symbolized images are analyzed in FIG. 3, it can be found that (i), (j), (k), (l), (m), (n), (o), (p), (q), (r), and (s) are symbolized images corresponding to "ㅈ," "ㅊ," "ㅋ," "ㅌ," "ㅍ," "ㅎ," "ㄲ," "ㄸ," "ㅃ," "ㅆ," and "ㅉ," respectively.

FIG. 4 explains a principle of creating symbolized images corresponding to characters which are the combinations of Korean initial consonants and vowels. However, vowels were expressed together with a consonant "ㅇ" without being expressed singly to be identified easily. As shown in FIG. 4, when symbolized images corresponding to the characters which are the combinations of initial consonants and vowels are created, square whole image frames in FIG. 3 are divided into initial consonant areas and vowel areas, just as shown in (a) and (b) of FIG. 7 (i.e., "space division") and symbolized images corresponding to initial consonants and vowels are created independently in the image frames of the initial consonants and those of the vowels, respectively.

A principle of creating symbolized images corresponding to initial consonants in image frames of the initial consonants is same as that explained in FIG. 3. In the present invention, square symbolized images corresponding to vowels in image frames of the vowels may be created as same shapes as those of the blank spaces of the vowels.

In accordance with the principles of creating symbolized images as shown above, when characters meant by individual symbolized images are analyzed in FIG. 4, it can be found that (a), (b), (c), (d), (e), (f), (g), (h), (i), (j), (k), and (l) are symbolized images corresponding to "아," "야," "어," "여," "오," "요," "우," "유," "으," "이," "애," and "애," respectively.

In case of a single vowel and a complex vowel "ㅔ" and a complex vowel "ㅖ" among vowels, to separate them, respectively, from "ㅓ" and "ㅕ," it is desirable that "ㅔ" is marked as "ㅓ+ㅣ" by dividing the image frame of a vowel into two spaces vertically as shown in (m) and (n), and "ㅖ" is marked as "ㅕ+ㅣ." Accordingly, (m) is a symbolized image corresponding to "에" while (l) is to "예."

In case of complex vowels among vowels, it is desirable that the symbolized image of each vowel is created individually while the whole image frame of the vowel is divided into a bottom part and a right end. Accordingly, (o), (p), (q), (r), (s), (t), and (u) are symbolized images corresponding to "와," "왜," "외," "워," "웨," "위," and "의."

When symbolized images corresponding to characters combined by initial consonants, vowels, and final consonants are created, square whole image frames in FIG. 3, first of all, are divided into initial consonant areas, vowel areas, and final consonants ("space division") as shown in (c) to (f) of FIG. 7 and symbolized images corresponding to initial consonants, vowels, and final consonants are independently created in the image frames of initial consonants, vowels, and final consonants, respectively.

FIG. 5 shows a principle of creating symbolized images corresponding to Korean final consonants in final consonant image frames. Because all of fourteen single consonants ("ㄱ," "ㄴ," "ㄷ," "ㄹ," "ㅁ," "ㅂ," "ㅅ," "ㅇ," "ㅈ," "ㅊ," "ㅋ," "ㅌ," "ㅍ," and "ㅎ,") and two double consonants ("ㄲ," and "ㅆ") as Korean initial consonants in FIG. 3 can also be used as Korean final consonants, redundant explanation will be excluded. By referring to FIG. 5, only a principle of creating symbolized images corresponding to eleven consonant blends ("ㄳ," "ㄵ," "ㄶ," "ㄺ," "ㄻ," "ㄼ," "ㄽ," "ㄾ," "ㄿ," "ㅀ," and "ㅄ") used as Korean final consonants will be explained.

Even in case of consonant blends which are used only final consonants without being used as initial consonants among Korean double consonants, just like other Korean double consonants, while an image frame of a final consonant is separated into two areas, symbolized images corresponding to respective separated consonants are created in the two separated image frames.

Accordingly, (a), (b), (c), (d), (e), (f), (g), (h), (i), (j), and (k) are symbolized images corresponding to "ㄳ," "ㄵ," "ㄶ," "ㄺ," "ㄻ," "ㄼ," "ㄽ," "ㄾ," "ㄿ," "ㅀ," and "ㅄ," respectively.

As such, in accordance with the principles of FIGS. 3 to 5, symbolized images may be created and images may be also created depending on modified shapes of symbolic signs as shown in FIG. 6.

More specifically, as shown in (a) and (b) of FIG. 6, the square symbolic signs that indicate vowels may be replaced with those in a short vertical line segment. As shown in (c), the square symbolic signs on left and right sides that indicate "ㄹ" among consonants are replaced with long horizontal lines, respectively or expressed in a shape of "Z" by connecting long horizontal line segments with a diagonal line segment or in a reduced shape of "z." Moreover, as shown in (d), (e), and (f), the square symbolic signs may be also replaced with short horizontal lines in middle-left and middle-right side ends among signs that represent "ㅈ," "ㅊ," and "ㅎ." Furthermore, as shown in (g), only the square symbolic sign in the middle-left side end of signs that represent "ㅋ" may be replaced with short horizontal line sections or as shown in (h), the square symbolic signs in the left side end that show "ㅌ" may be replaced with long horizontal line sections, respectively. In addition, as shown in (i), only the square symbolic sign in the center of the signs that show "ㅂ" may be replaced with a short line section.

By referring to FIG. 1 again, the creating part 121 in accordance with one example embodiment may create a symbolized image at a position corresponding to that of a blank space of a character image falling under a Korean character inputted through the input part 110. In detail, symbolized images corresponding to an initial consonant and a vowel are created independently in respective image frames of the initial consonant and the vowel after a square whole image frame is divided into areas of the initial consonant and the vowel, just as shown in (a) and (b) of FIG. 7 (space division), or symbolized images corresponding to an initial consonant, a vowel, and a final consonant are created independently in respective image frames of the initial consonant, the vowel, and the final consonant after a square whole image frame is divided into areas of the initial consonant, the vowel, and the final consonant, as shown in (c) through (e) of FIG. 7 (space division) and then displayed on the display screen of the output part 140 or printed through a printer.

In addition, the creating part 121 extracts symbolized images that are mapped to a character inputted by a user and are stored in the storage part 130 and then displays on the display screen of the output part 140, transmits, or prints through a printer, symbolized images corresponding to an initial consonant and a vowel independently in image frames of the initial consonant and the vowel as areas thereof into which a square whole image frame is divided, as shown in (a) and (b) of FIG. 7 (space division), or those corresponding to an initial consonant, a vowel, and a final consonant independently in image frames of the initial consonant, the vowel, and the final consonant as areas thereof into which a square whole image frame is divided, as shown in (c) through (e) of FIG. 7 (space division).

In accordance with another example embodiment, a user may input a symbolized image, which s/he wants to output (e.g., display, transmit, print through a printer, etc.) as a form of a character of a language. In case of a character combined by an initial consonant and a vowel of a Korean syllable, the user selects either of (a) and (b) of FIG. 7. Meanwhile, in case of a character combined by an initial consonant, a vowel, and a final consonant of a Korean syllable, the user selects one of (c) through (e) of FIG. 7. Then, symbolic signs are placed in divided areas included in the selected template among (a) through (e) of FIG. 7. Then, a step of allowing a user to select a shape of symbolic signs (such as a dot, a line, a plane, etc.) is provided and if the user selects "a dot," a step of allowing a user to select a shape of the dot (such as triangle, square, circle, etc.) is provided.

In another example embodiment, it would be possible to allow a user to select a shape of a figure first and then select one of a dot, a line, and a plane.

As such, when a symbolic sign is placed in part of the space divided (space division) from a certain blocked space (e.g., a square whole image frame), the creating part 121 interprets the symbolized image inputted through the input part 110 and then extracts a character stored in the storage part 130 mapped to the symbolized image to thereby output the character of the language through the output part 140.

As such, the user may input information on the character the language which s/he wants to output (e.g., display, transmit, print through a printer, etc.) as a symbolized image, or the user may input information on a symbolized image which the user wants to output (e.g., display, transmit, print, through a printer, etc.) as the character of the language.

In a numerals-inputting mode, it is possible to express with a total of ten Arabic numerals. In other words, the Arabic numerals are composed of "0," "1," "2," "3," "4," "5," "6," "7," "8," and "9."

A symbolized image of an Arabic numeral can be expressed by placing s1ymbolic signs on part of a certain blocked space (e.g., a square whole image frame). Because the numerals are not divided into initial consonants, vowels, and final consonants, the blocked spaces are not necessary to be divided again. Herein, the symbolic signs are simplified into a dot, a line or a plane from a shape identified from a blank space by putting the Arabic numerals into a specific frame, where the dot may have triangle, square, circle, or other various shapes.

Figure 8:
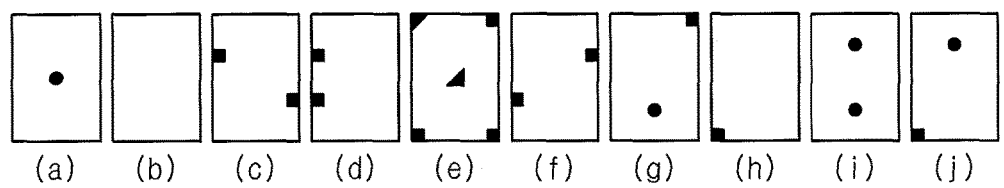
FIG. 8 is a drawing showing a principle of creating symbolized images corresponding to Arabic numerals in accordance with one example embodiment of the present invention.
Figure 9:
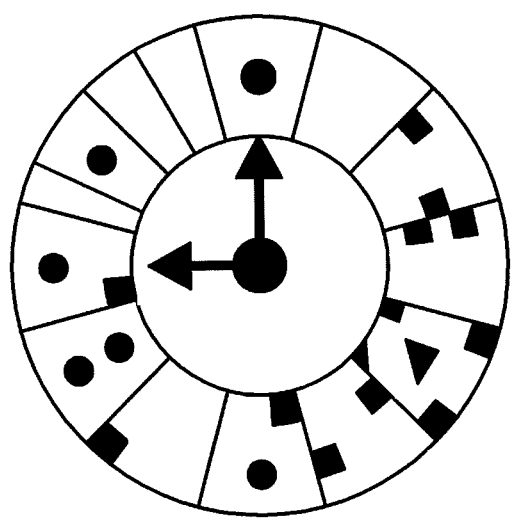
FIG. 9 is a drawing exemplifying the design of a clock by utilizing numerals expressed by space division and symbolic signs in accordance with one example embodiment of the present invention.
Figure 10:
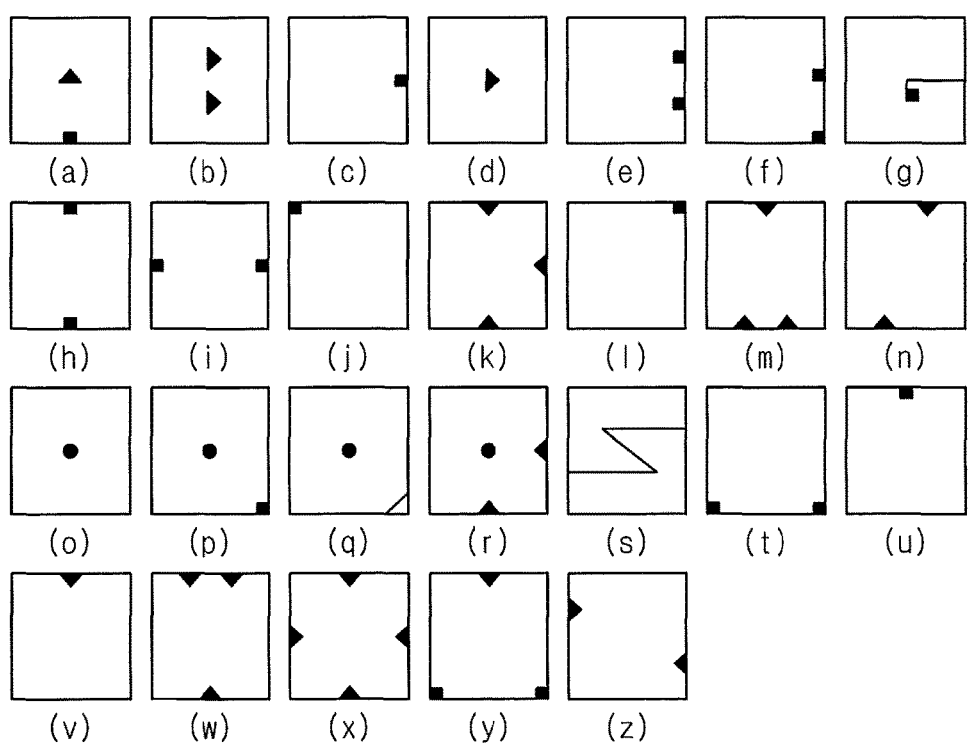
FIG. 10 is a diagram illustrating a principle of creating symbolized images corresponding to English uppercase characters in accordance with one example embodiment of the present invention.

FIG. 8 explains a principle of creating symbolized images corresponding to Arabic numerals in numeral image frames. In FIG. 8, (a), (b), (c), (d), (e), (f), (g), (h), (i), and (j) are symbolized images corresponding to numerals "0," "1," "2," "3," "4," "5," "6," "7," "8," and "9." As shown above, symbolized images corresponding to numerals may express numerals by space division and symbolic signs Fig. in application to a clock as seen in FIG. 9.

In an English words-inputting mode, it is possible to express with a total of 52 English characters consisting of 26 uppercase and 26 lowercase characters. The twenty-one alphabet characters, except the five vowels, i.e., "A(/a)," "E(/e)," "I(/i)," "O(/o)", "U(/u)," among 26 characters, are called "consonants." In other words, the uppercase characters (/lowercase characters) of the English alphabet consist of 21 consonants (i.e., "B(/b)," "C(/c)," "D(/d)," "F(/f)," "G(/g)," "H(/h)," "J(/j)," "K(/k)," "L(/l)," "M(/m)," "N(/n)," "P(/p)," "Q(/q)," "R(/r)," "S(/s)," "T(/t)," "V(/v)," "W(/w)," "X(/x)," "Y(/y)," and "Z(/z)") and five vowels (i.e., "A(/a)," "E(/e)," "I(/i)," "O(/o)," and "U(/u)").

As explained above, there will exist a technical demand for a method for mapping out designs of industrial products (such as products, works of art, structures, handcrafts, buildings, etc.) by using symbolized images that symbolizes characters such as Korean characters, English characters, and numerals. Therefore, the present invention additionally suggests a design mapping-out device 200 which uses the symbolized images in the present invention as shown in FIG. 11.

Figure 11:
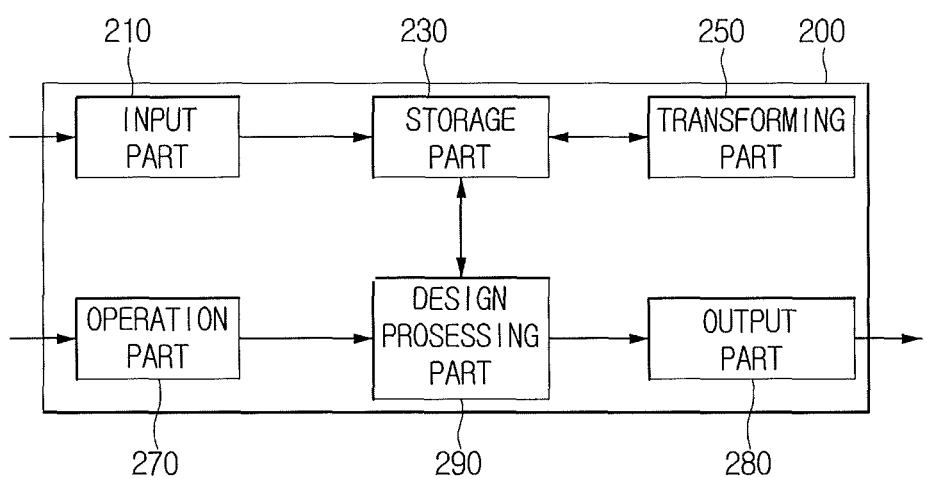
FIG. 11 is a functional block diagram representing a configuration of a device for mapping out design by using a symbolized image in accordance with the present invention.

More specifically, by referring to FIG. 11, the design mapping-out device 200 which uses symbolized images in accordance with the present invention includes an input part 210, a storage part 230, a transforming part 250, an operation part 270, a design processing part 290, and an output part 280.

First of all, when a user maps out a design of an industrial product through the input part 210 of the design mapping-out device 200, information on a character the user wants to use or a created symbolized image corresponding to the information on the character, and information on files (including image files, 3D CAD files, information on mapping out of urban planning, etc.) regarding an industrial product such as a product, a work of art, a structure, a handcraft, a building, etc. as an object of design for which s/he intends to map out a design are inputted and stored in the storage part 230 for design mapping-out work in the future.

Concretely, a symbolized image the user intends to use for mapping out a design would be inputted through the input part 210 from an external storage device such as a USB drive, or would be also downloaded into the storage part 230 from external database where the symbolized image is stored.

Besides, file information with respect to an object of design would be also inputted through the input part 210 from an external storage device such as a USB drive, or image files which have been searched by using keyword searches through external database would be downloaded in the storage part 230 therethrough.

In addition, the shape, structure, color, size, position, material, texture, environment information, etc. of an object of design could be inputted as well through the input part 210 and information on the size, proportion, shape, position, material, etc. of a symbolized image to be expressed by being combined with the object of design could be decided and inputted by a designer.

Figure 2:
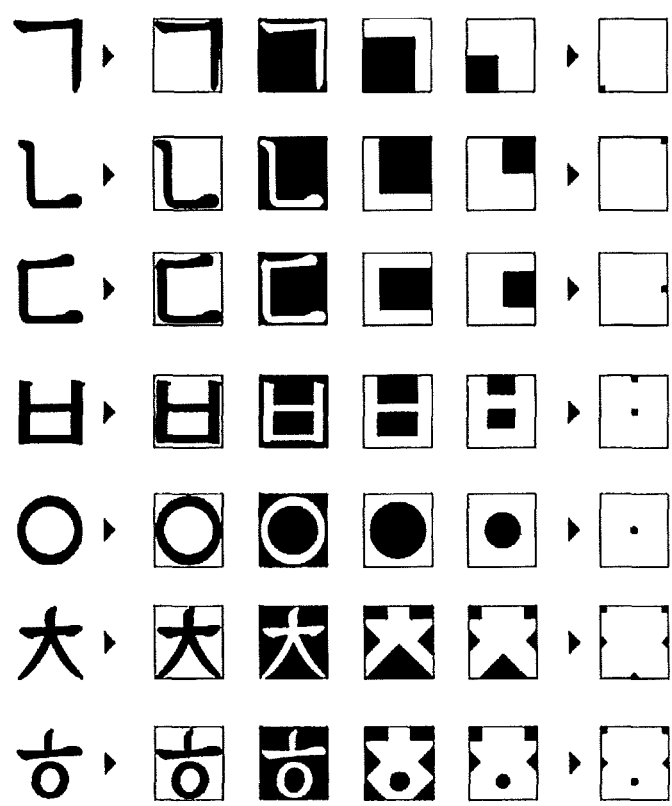
FIGS. 2 and 28 are diagrams showing courses of extracting symbolized images in accordance with one example embodiment of the present invention.

Meanwhile, when information on a character is inputted through the input part 210, the transforming part 250 of the design mapping-out device 200 transforms the information on the character to a symbolized image corresponding to the information on the character by using a course explained with FIG. 2 and the created symbolized image is stored in the storage part 230 for future design mapping-out work.

If information on a character of a foreign language is inputted through the input part 210, the transforming part 250 could translate information on the character of the foreign language automatically to information on a Korean character depending on the selection of a designer through the operation part 270, and then transform the information on the Korean character into a symbolized image corresponding thereto.

As such, if information on a Korean character is inputted through the input part 210, the transforming part 250 could translate information on the Korean character automatically to information on a character of a foreign language depending on the selection of a designer through the operation part 270, and transform the information on the foreign character into a symbolized image corresponding thereto.

Additionally, the operation part 270 of the design mapping-out device 200 could be used by a designer to perform a variety of operations including zoom-in, zoom-out, adjustment for proportion, deletion, etc. and a user could also input information on a special character which s/he intends to use for mapping out design through a keyboard disposed in the operation part 270 of the design mapping-out device 200.

Moreover, a design processing part 290 of the design mapping-out device 200 performs a function of mapping out an object of design by revising and transforming data files of the object to make a symbolized image expressed on the object of design by the inputted operation and the revising command through the operation part 270 and the image of the object of design mapped out by the design processing part 290 is outputted outside through the output part 280 such as a screen or a printer.

Figure 12:
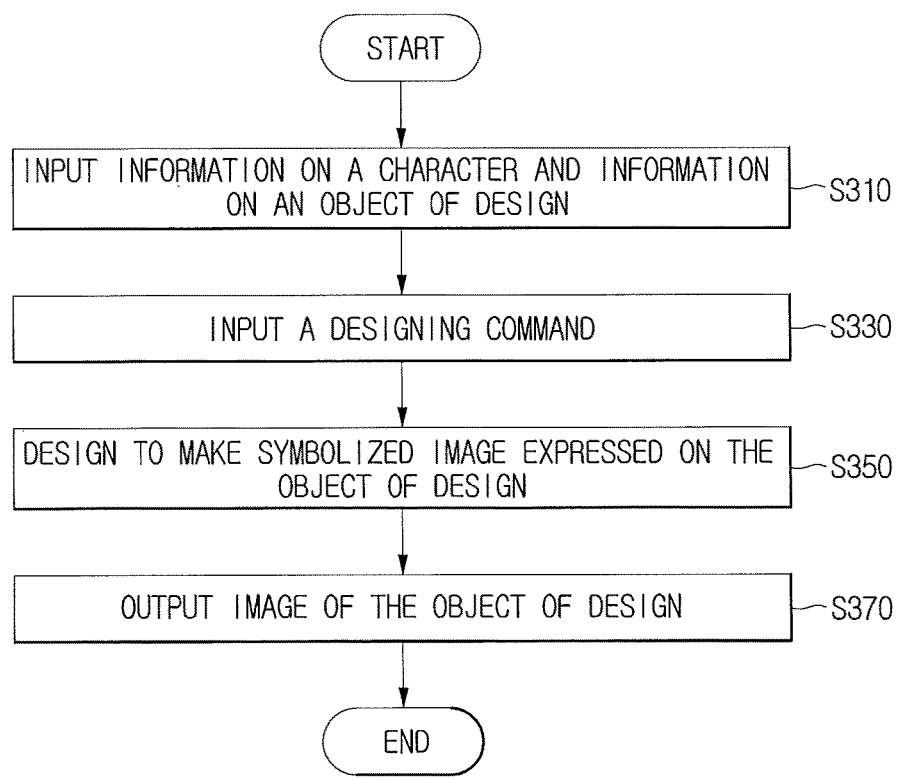
FIG. 12 is a process flowchart explaining how to map out a design by using a symbolized image in accordance with the present invention.

FIG. 12 is a process flowchart explaining how to create design by using a symbolized image in accordance with the present invention. To explain the method for using the symbolized image in accordance with the present invention by referring to FIGS. 11 and 12, information on a character that a designer wants to use as well as file information (including image files, 3D CAD files, etc.) on the industrial product such as a product, a work of art, a structure, a handcraft, a building, etc. as an object of design of which a user wants to map out a design is inputted through the input part 210 of the design mapping-out device 200 at a step of S310 and the information is stored in the storage part 230 for design mapping-out work in the future.

The transforming part 250 of the design mapping-out device 200 transforms the information on the character inputted through the input part 210 at the step of S310 above into a symbolized image corresponding thereto and the symbolized image may be stored in the storage part 230 for future design mapping-out work.

Upon carrying out the present invention, at the step of S310 as mentioned above, an existing symbolized image, instead of character information being inputted through the input part 210, could be inputted, in which case, it would be desirable that the transforming part 250 extracts character information corresponding to the inputted symbolized image and the extracted character information is stored in the storage part 230.

Meanwhile, upon extracting character information from the inputted symbolized image through the input part 210, the transforming part 250 of the design mapping-out device 200 could extract the character from the symbolized image by reversely applying operations of creating symbolized images from individual characters in FIG. 2.

The character information extracted through the transforming part 250 and the character information directly inputted through the input part 210 could be displayed with an image of an object of design finally mapped out by applying symbolized images corresponding to the character information, to thereby represent the information on the character information formed on the object of design.

Upon the execution of the aforementioned step of S310, while information on the symbolized image used for mapping-out and information on the object of design is stored in the storage part 230, a designer inputs a detailed designing command through an operation of the operation part 270 at a step of S330.

Accordingly, the design processing part 290 of the design mapping-out device 200 performs designing to make a character shaped on the object of design by revising and transforming data files of the object of design to make the symbolized image corresponding to the character expressed on the object of design according to the designing command of the designer at a step of S350.

Meanwhile, an image of the object of design mapped out by the design processing part 290 is stored in the storage part 230, and the image of the object of design is outputted externally through the output part 280 such as a screen or a printer according to an operation command of the designer through the operation part 270 at a step of S370.

To explain the designing function of the design processing part 290 concretely at the step of S350 as mentioned above, the design processing part 290 could also transform the structure of the object of design depending on the shape of the symbolized image according to a designer's operation command.

For example, if aerial photograph of a series of buildings to be built in a block are shot, the design processing part 290 could adjust a construction position and an interval of the buildings in the block and colors, shapes, sizes, and materials of the block to make the shape of the created symbolized image corresponding to a character inputted by a designer expressed on the buildings.

Figure 13:
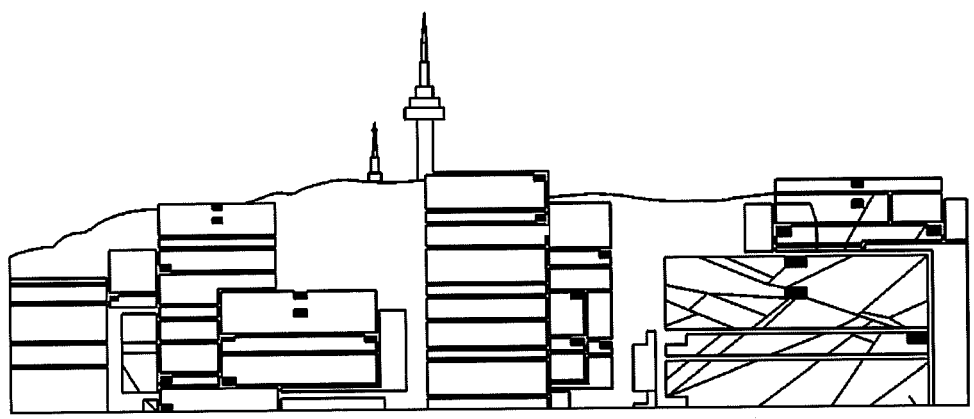
FIGS. 13 to 17, 29, and 30 are drawings representing the objects of design mapped out by a method for mapping out designs by using symbolized images in accordance with the present invention.

Besides, at the step of S350 as mentioned above, the design processing part 290 could revise an appearance of the object of design depending on the shape of the symbolized image according to a designer's operation command. More specifically, the design processing part 290 of the design mapping-out device 200 could revise a shape, a form, a material, a size, position, and a color of the facade of each building to make symbolized images intended by the designer be displayed in consecutive order when the multiple buildings are shown from the front thereof, as shown in FIG. 13.

Figure 14A:
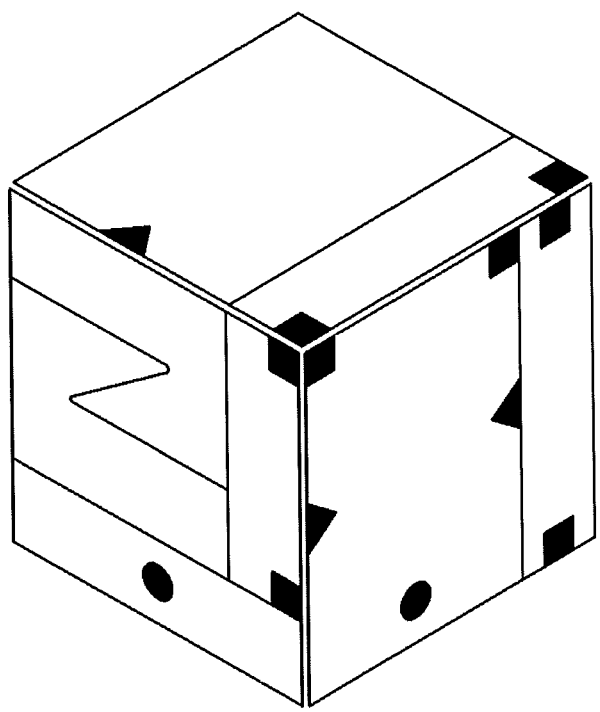

As shown in FIG. 14A, upon designing a cubic box, the design processing part 290 of the design mapping-out device 200 could map out the cubic box to make individual symbolized images corresponding to "사," "랑," and "해," as characters inputted by a designer, displayed on the top, front, and side of the box, respectively.

Figure 14B:
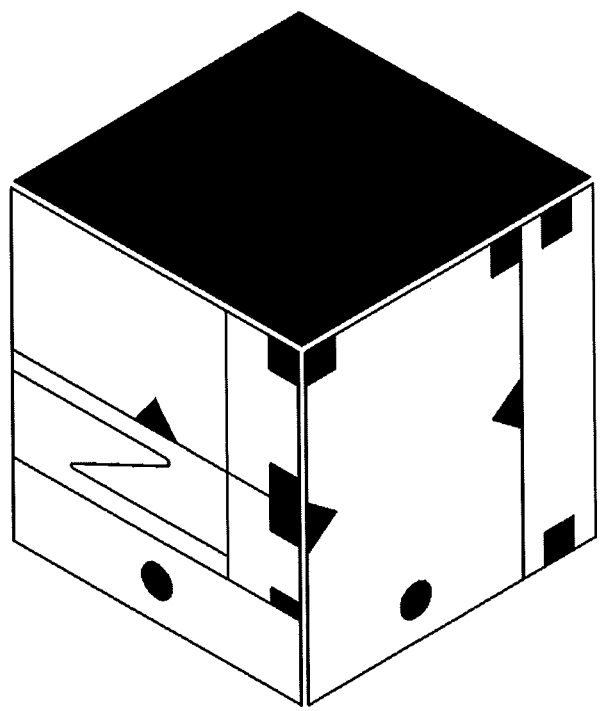

Besides, as shown in FIG. 14B, upon designing a cubic box, the design processing part 290 of the design mapping-out device 200 could make no symbolized image displayed on the top of the box, symbolized images corresponding to "사" and "랑" displayed in front thereof, and the symbolized image corresponding to "해" displayed on the side thereof.

Figure 14C:
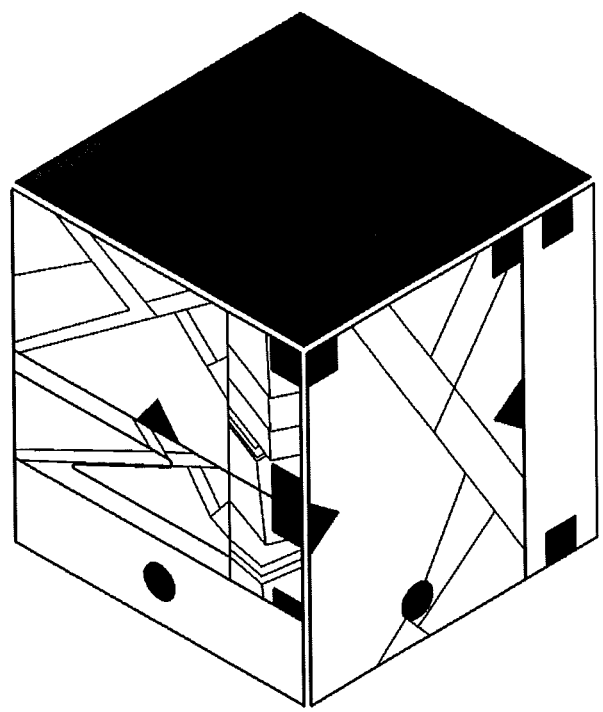

Furthermore, the design processing part 290 of the design mapping-out device 200 could also enhance completion of the appearance design of the box structure as shown in FIG. 14C by displaying an additional pattern on the box designed in FIG. 14B.

Figure 15:
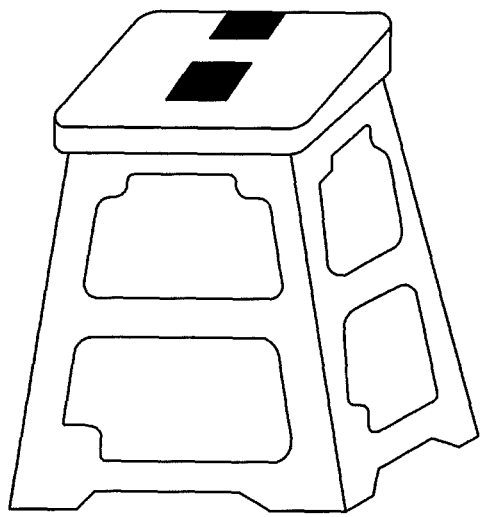

FIG. 15 is a drawing representing an image of a chair designed by using the design mapping-out device 200 in accordance with the present invention. It could be confirmed that a design embodying "복" on the chair in FIG. 15 is reflected by displaying a symbolized image corresponding to "ㅂ" as a character inputted by the designer on the chair seat in FIG. 15 and symbolized images corresponding to "ㅗ" and "ㄱ" as shapes of holes formed in the center of leg supports supporting the chair seat in serial order.

Upon the execution of the present invention, to make "복" recognized when the chair is seen from every angle, it is desirable to design the leg supports symmetrically to make them have the same shape in all four directions as shown in FIG. 15 and accordingly, it is desirable to design the symbolized image on the top of the chair symmetrically (so-called four-directional design) to make "ㅂ" perceived in all four directions. That is, the symbolized image on the top of the chair may include four symbolic signs.

Besides, in this case, it would be possible to prevent users from being confused due to the four-directional design on the chair seat by matching colors in the respective directions of the leg supports with those of the respective symbolic signs on the top of the chair.

Figure 16:
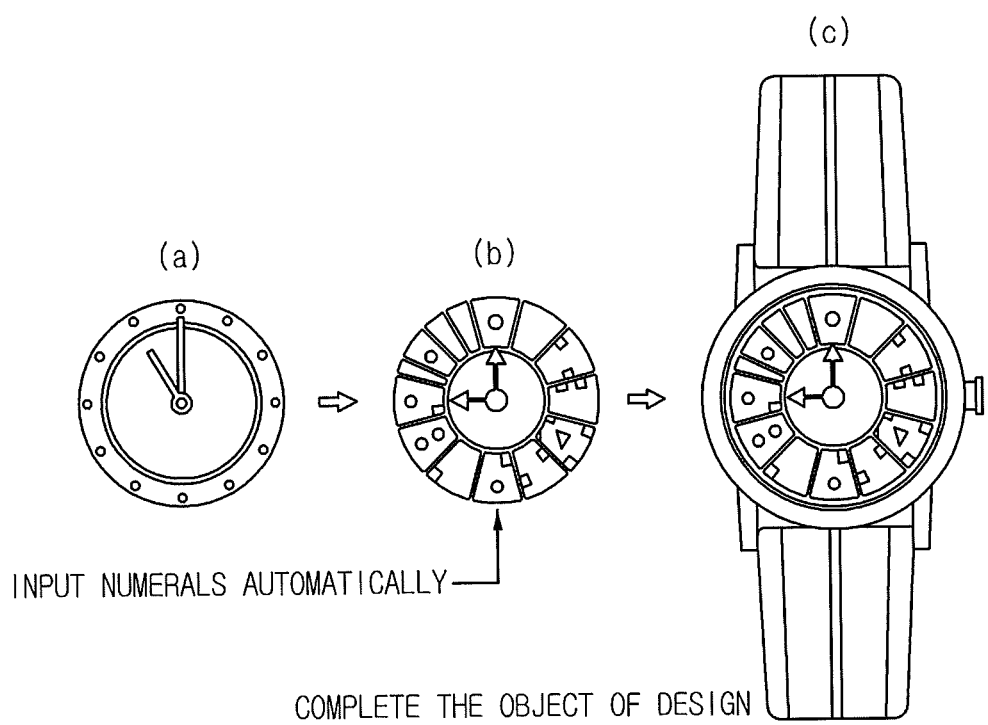

FIG. 16 shows drawings representing a course of mapping out an image of a clock by using the design mapping-out device 200 in accordance with the present invention. If a clock image is inputted as an image of an object of design as shown in (a) of FIG. 16, the design processing part 290 maps out the object of design as shown in (b) in FIG. 16 to make a symbolized image created through a course of creating the symbolized image as shown in FIG. 9 portrayed in the image of the clock and creates a final image as shown in (c) of FIG. 16 by additionally creating an image of a watch strap and combining it with the image of the clock.

Figure 17A:
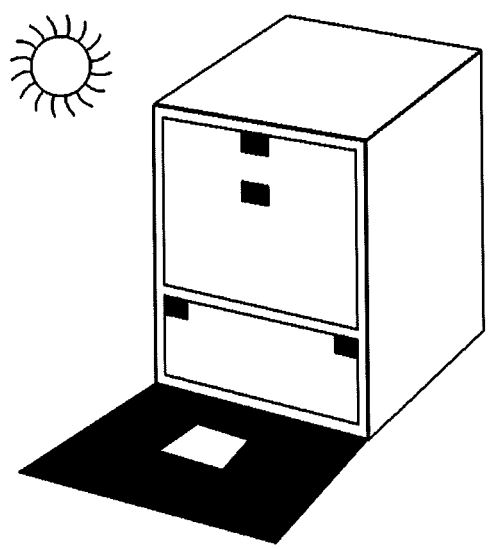

Moreover, upon mapping out an external surface of a building, as shown in FIG. 17A, the design processing part 290 of the design mapping-out device 200 could represent "봄" by expressing a symbolized image corresponding to "보" as a character inputted by a designer in front of the building and expressing "ㅁ" in use of a white square structure to separate it brightly in an area of a shadow of the building casted by the sun in comparison with the shadow.

Figure 17B:
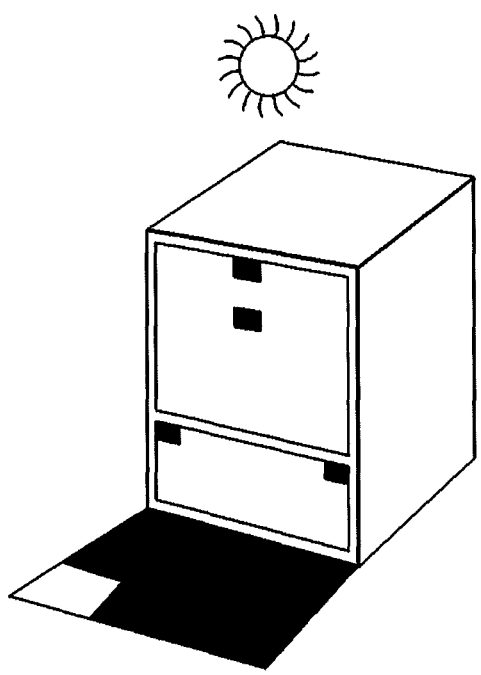

Moreover, as shown in FIG. 17B, in consideration of an altitude and a trajectory of the sun and the shadow of the building cast thereby, it would be possible to map out to express "복" by combining the symbolized image "보" in front of the building with "ㄱ" represented by the shadow of the building and the white structure.

As such, in accordance with the present invention, an object of design may be mapped out with natural phenomena such as a shadow, an image projected on the surface of the water, snowing by seasonal change, melting of accumulated snow, autumn colors, and wind, as symbolized images. In other words, when the design processing part 290 executes the mapping-out considering a natural phenomenon as explained above, the object of design may represent an image of a special character depending on the natural phenomenon.

For example, a symbolized image could be expressed only in autumn by placing trees that turn red in autumn after being kept green in spring and summer. For another example, a symbolized image could be expressed in winter by melting snow at a specific part in use of hot wires installed at the specific part in winter.

Besides, when it becomes heated in summer in excess of a preset temperature, a warning message such as "Careful to Avoid Heatstroke," or "Ozone Warning" could be expressed by mapping out pavements to make the symbolized image appear. As such, characters may be expressed by using all buildings and other spaces in cities.

Besides, a design could be mapped out to implement a symbolized image on an external surface of an object of design by installing on the external surface of the object of design both a first type of pinwheels spinning when the wind blows and a second type of pinwheels not spinning although the wind blows. Thus, while the wind is not blowing, the symbolized image is not displayed, but while the wind is blowing, since only the first type of pinwheels is spinning, the symbolized image is expressed on the external surface of the object of design.

As such, it would be desirable to provide a state of a symbolized image expressed with respect to an object of design depending on natural phenomena as "Preview" to a user through the output part 280 by using a simulation function provided in the design processing part 290.

Furthermore, it would be desirable that the design processing part 290 automatically offers a variety of possibilities of a symbolized image being combined with an object of design by analyzing a shape, a structure, a material, a position, a size, a color, gloss, texture, or an installation environment of the object of design to a designer through the output part 280 and the designer would optimize the implementation of the symbolized image to the object of design through editing work through the operation part 270 again by referring to a variety of examples of combinations offered through the output part 280.

Meanwhile, it is desirable that the auto designing function as explained above provided by the design processing part 290 is applied in the design of a small-sized object of design. However, it is more appropriate to apply a method for the designer granting a particular characteristic through the operation part 270 than to apply auto designing if the large-sized object of design such as a building is considered.

Besides, the design processing part 290 could perform a function of automatically checking stability by analyzing the load distribution of the object of design whose design or edited design is completed. To this end, it could be desirable to make a load analyzing program used for civil and architectural engineering installed in the design processing part 290.

Furthermore, the design processing part 290 may design a symbolized image, which is in a visually identifiable shape, on the external surface of the object of design, but could design the symbolized image that is not visually identifiable but can be recognized through special equipment such as an infrared camera by mapping out the sign made to be portrayed on the object of design in use of ultraviolet rays, infrared rays, micro-current, sound wave, a specimen as result of a chemical reaction, etc.

In addition to this, designs of both the symbolized image that is visibly identifiable and the other that is not could be applied to the same object of design at the same time.

Furthermore, the design processing part 290 of the design mapping-out device 200 could design to make the silhouette of the symbolized image changed by changing a color of a space division line of the symbolized image identically to that of the background color. For instance, if a blank space division line and symbolized images are expressed on a white background, and if the symbolized image and the space division line turn white and the white space turns black, a shape of a character could be expressed in silhouette. This is because the space division line is changed to the same color as the background and seems to disappear.

Moreover, upon applying a symbolized image to an entire design, the design processing part 290 could also design the symbolized image encrypted to be expressed on the external surface of the object of design. More specifically, it could be also implemented to make the symbolized image recognized outside only if an electric bulletin board is consecutively shot by decorating the external surface of the object of design with multiple bulbs to be illuminated to portray the symbolized image in serial order in turns, instead of making all of them turn on at the same time.

Moreover, upon the execution of the present invention, if the transforming part 250 creates a symbolized image corresponding to information on a character inputted through the operation part 270 of the design mapping-out device 200, and the created symbolized image is transmitted to an electric bulletin board installed outside, the object of design mapped out through the design mapping-out device 200 by the designer could be immediately implemented through the electric bulletin board by controlling the lighting of the electric bulletin board.

Figure 29:
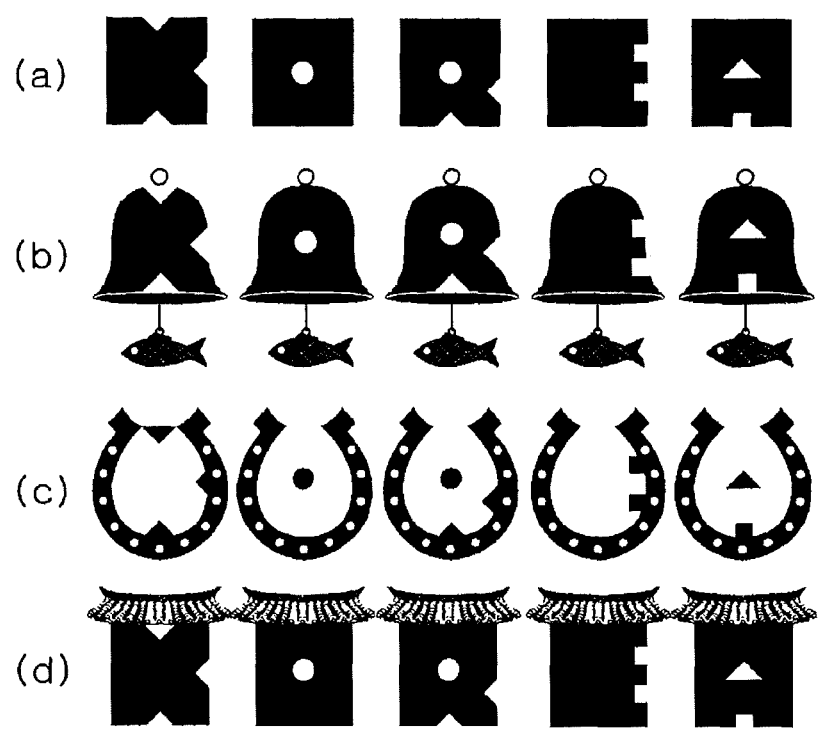

Furthermore, upon the execution of the present invention, the transforming part 250 could create a symbolized image corresponding to a character information (KOREA) inputted through the operation part 270 of the design mapping-out device 200 as shown in (a) of FIG. 29 and the design processing part 290 could express the symbolized image on a variety of cultural images as shown in (b), (c), and (d) of FIG. 29.

Figure 30:
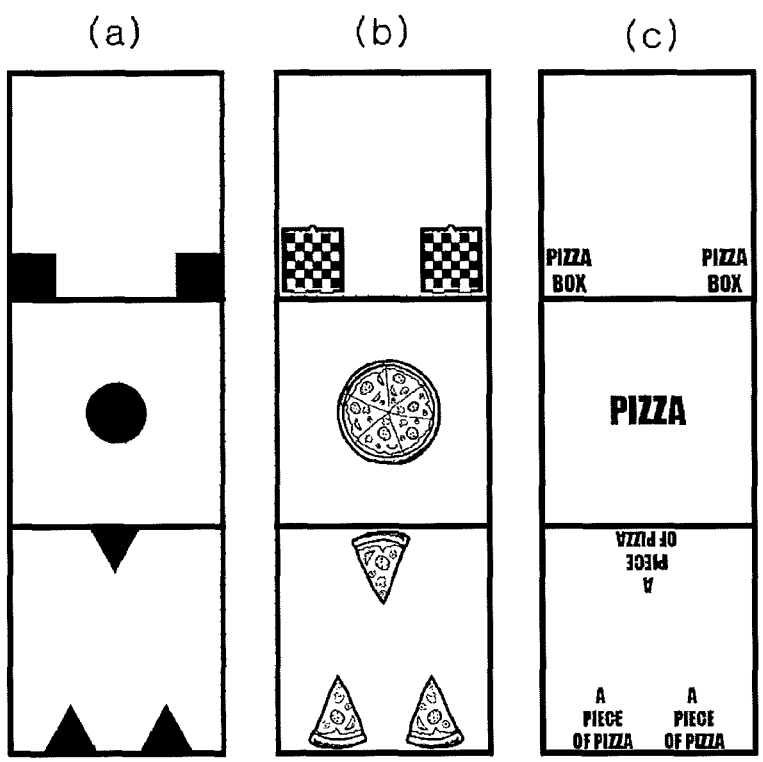

In addition, upon the execution of the present invention, the transforming part 250 could create a symbolized image corresponding to a character information (TOM) inputted through the operation part 270 of the design mapping-out device 200 as shown in (a) of FIG. 30 and the design processing part 290 could transform the symbolized image as shown in (b), and (c) of FIG. 30.

In this case, the design mapping-out device 200 could be a smart phone where an application program supporting each of the above-mentioned functions is installed and a foreign tourist who inputs his or her name, the name of country or city to visit, and a visit date while keeping the smart phone as such could have commemorative photographing in front of a symbolized image where the character is shaped.

Figure 18:
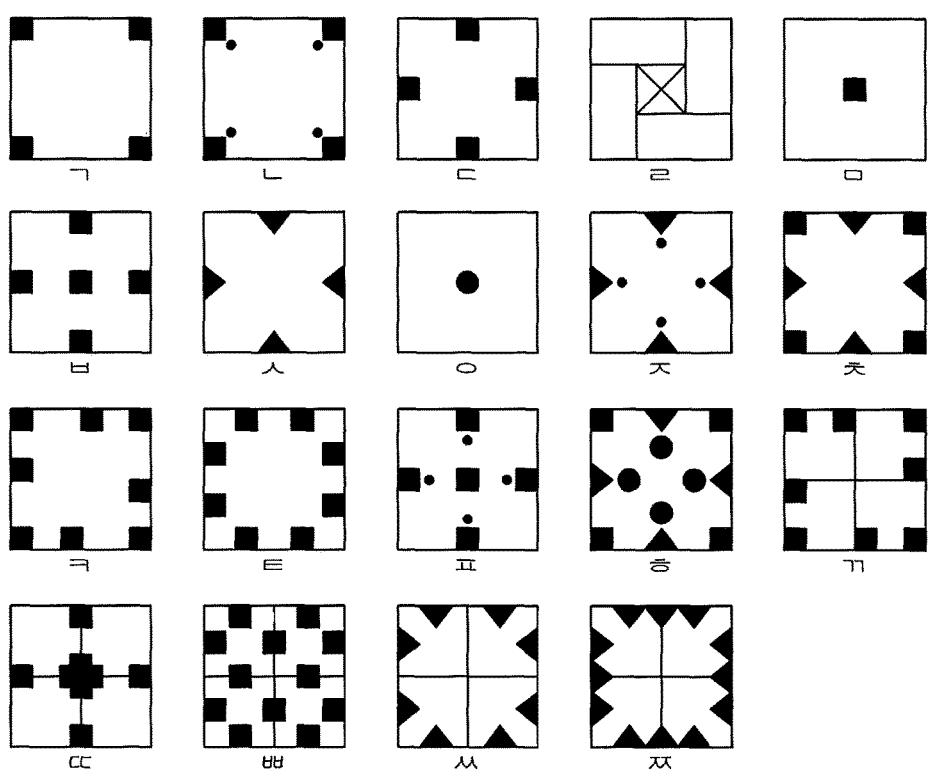
FIG. 18 is a diagram showing symbolized images with 4 directional characteristics as modified examples of symbolized images in accordance with the present invention.
Figure 19:
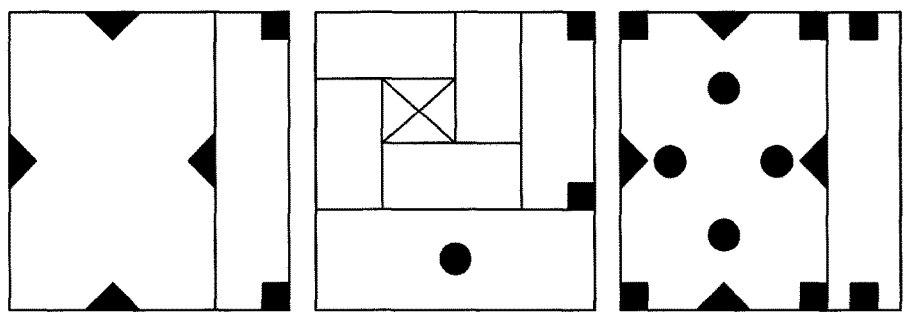
FIG. 19 is a diagram showing examples of use of the symbolized images with 4 directional characteristics in FIG. 18.

In accordance with the present invention, the design mapping-out device 200 could use a symbolized image as shown in FIGS. 18 and 19 upon the designing of the object of design at the step of S350 as aforementioned.

The symbolized images in FIG. 18 are so-called four-directional images. The respective four-directional images include four symbolic signs which are created by rotating a symbolic sign 90 degrees. In case of designing a chair like FIG. 15, a symbolized image "복" is portrayed only from a frontal view but when the same symbolic signs are expressed in all directions, i.e., front, back, left, and right, the same symbolic signs are inputted four times as shown in FIG. 18 to thereby create four-directional symbolized image "ㅂ" on the top of the chair.

FIG. 19 shows examples of using the four-directional symbolized images in FIG. 18, and it illustrates expression of "사랑해" by transforming the respective initial consonants of individual syllables of "사랑해" into four-directional symbolized images.

Figure 20:
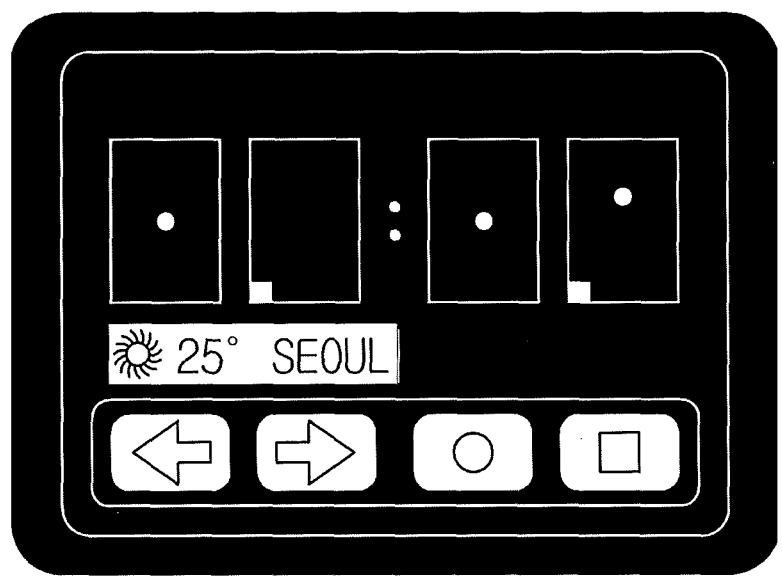
FIG. 20 is a diagram showing another object of design mapped out by a method for mapping out designs by using symbolized images in accordance with the present invention

In accordance with the present invention, the object of design mapped out at the step of S350 as explained above could be a display part of a mobile phone or an electronic clock as shown in FIG. 20 and more specifically, the design mapping-out device 200 could design numeral information on the display part (07:09) by applying the symbolized image.

Meanwhile, symbolized images used in the present invention (i.e., symbolic characters, dotted characters, or identification characters) are symbolic characters to promote the combinations of characters and 2D-images two-dimensionally and the combinations between 3D objects and characters three-dimensionally. They could increase the value of objects and spaces by including messages that a creator intends metaphorically because they could not be easy to be read due to their geometrical composition but could be easily combined with an object and a space.

In addition, today, mass production has led mass consumption and prices of products and brands have emphasized the values of the products under such consumption patterns but due to easy combinations of products and characters by the present invention, a user could find new values other than prices and brands through the meaning of characters combined with products by granting a special meaning for a purchase, including birthday, wedding, etc.

The present invention could be used more excitedly in the fields of handicraft, art, architecture, interior design, fashion, lighting design, and urban planning. Because characters can be expressed metaphorically, characters which do not damage the nature of works can be easily expressed and characters that contain the philosophy, intention, hope, and favorite meaning of an author can be easily combined and could be developed to a new creative genre as well.

In particular, buildings in many developing countries have a square structure. Thus, this technology could be proposed as an effective method for granting a new characteristic by expressing a symbolized image at a low price just like changing a structure slightly to such buildings or painting.

The present invention will exert strong power by being combined with a smart device. Even those who have not taken professional design programs can implement and share a new creative work that contains their own special meanings by using this technology and select a subject of, and a method for, sharing, freely.

Thanks to the development of smart devices, people will experience visual responses combined with electronics information in the future. As these have been generalized gradually, innovative change by using them will be expected even in the fields of art, architecture, design, and advertising. The present invention can be summarized to relate to use characters in this era and express and interpret characters connected with science and technology.

In particular, the present invention has a meaning of expanding the scope of expression by expressing characters two- or three-dimensionally in use of science and technology or combining a means of expression of characters with a natural phenomenon such as light or autumn colors. The most interesting characteristic could be that modern people may use their living spaces and natural phenomena as targets to express characters just as prehistoric people expressed characters on a cave or a rock.

As shown in FIGS. 13 through 17, when an object of design designed by the design mapping-out device 200 in accordance with the present invention is installed and built in an outdoor space, it might be difficult for general users to easily identify specifically which symbolized image is implemented in the object of design.

In other words, as explained above, solutions for analyzing and interpreting designs to easily explain to general users specifically which symbolized images are implemented in industrial products are required to be provided as well.

Figure 21:
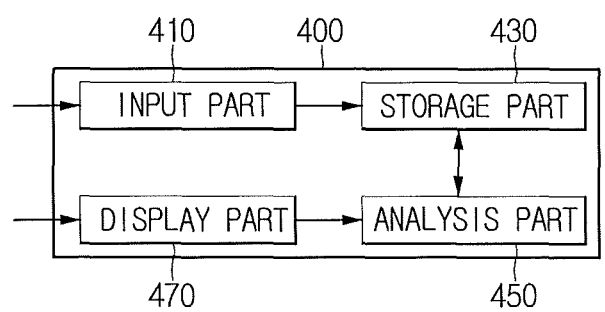
FIG. 21 is a functional block diagram representing a configuration of a device for analyzing an object of design in accordance with the present invention.

Therefore, a device 400 for analyzing the object of design where symbolized images are applied, as shown in FIG. 21, in the present invention came to be additionally devised.

By referring to FIG. 21, the device 400 for analyzing the object of design where symbolized images are applied in accordance with the present invention include an input part 410, a storage part 430, an analysis part 450, and a display part 470.

First of all, information on an object of design implemented to make symbolized images expressed is inputted through the input part 410 and then stored in the storage part 430. More specifically, the information on the appearance of the object of design could be a file of an image which includes the object of design, etc. and could be inputted through the input part 410 from an external storage device such as a USB drive and be downloaded to the storage part 430 through the input part 410 from external database where the information on the appearance of the object of design is stored.

The analysis part 450 of the device 400 for analyzing the object of design extracts symbolized images implemented to the object of design by analyzing the information on the appearance of the object of design and performs a function of recognizing information on a character corresponding to the symbolized image. The display part 470 performs a function of providing recognized information to a user by displaying information on the symbolized image and the character acquired by the analysis part 450.

Upon the execution of the present invention, the device 400 for analyzing the object of design could have a separate camera module and shoot the object of design directly through it to acquire an image file including the information on the appearance of the object of design. As such, the image file acquired by the camera module would be stored in the storage part 430 to perform analysis through the analysis part 450.

Figure 22:
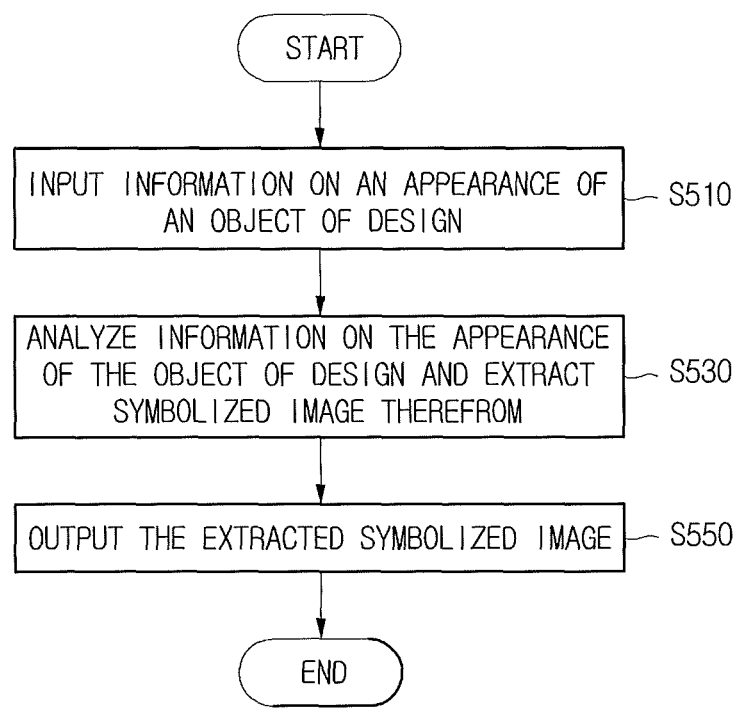
FIG. 22 is a process flowchart explaining a method for analyzing an object of design in accordance with the present invention.

FIG. 22 is a process flowchart explaining a method for analyzing an object of design where a symbolized image is applied in accordance with the present invention. To explain a method for analyzing the object of design where the symbolized image is applied in accordance with the present invention by referring to FIGS. 21 and 22, the information on the appearance of the object of design is inputted through the input part 410 of the device 400 for analyzing the object of design at a step of S510 and the information on the appearance of the object of design is stored in the storage part 430 for analysis.

Based on the information on the appearance of the object of design stored in the storage part 430, the analysis part 450 of the device 400 for analyzing the object of design extracts a symbolized image implemented on the object of design and analyzes information on a character corresponding to the symbolized image at a step of S530.

More specifically, if the image of the object of design as shown in FIG. 14A is inputted through the input part 410 of the device 400 for analyzing the object of design, the analysis part 450 extracts the symbolized image portrayed on the upper side of a box as the object of design through the analysis of the image of the upper side of the box and recognizes "사" as its corresponding character information from the extracted symbolized image.

Besides, the analysis part 450 extracts a symbolized image portrayed in front of the box through the analysis of the image and recognizes "랑" as its corresponding character information from the extracted symbolized image. Further, it extracts, a symbolized image portrayed on a side of the box through the analysis of the image and recognizes "해" as its corresponding character information from the extracted symbolized image.

Upon extracting a symbolized image from image information on the appearance of an object of design, it is desirable that the analysis part 450 uses a method for selecting a symbolized image with the highest degree of coincidence through pattern matching algorithm which compares a variety of symbolized images pre-stored in the storage part 430 with image information on the appearance of the object of design inputted in the input part 410 one on one.

Besides, the analysis part 450 may extract character information from the extracted symbolized image by reversely applying the operation of creating symbolized images from individual characters of FIG. 2.

In addition, information on the extracted symbolized image and information on the character is provided to the user by being displayed through the display part 470 of the device 400 for analyzing the object of design at a step of S550.

As well, when the image of the object of design as shown in FIG. 15 is inputted through the input part 410 of the device 400 for analyzing the object of design, the analysis part 450 extracts a symbolized image displayed on the top of the chair seat through the analysis of the image thereon and recognizes "ㅂ" as character information corresponding to the extracted symbolized image.

Furthermore, the analysis part 450 extracts symbolized images through the analysis of the images of the leg supports which support the chair seat and analyzes "ㅗ" and "ㄱ" as character information corresponding to the extracted symbolized images.

Figure 23:
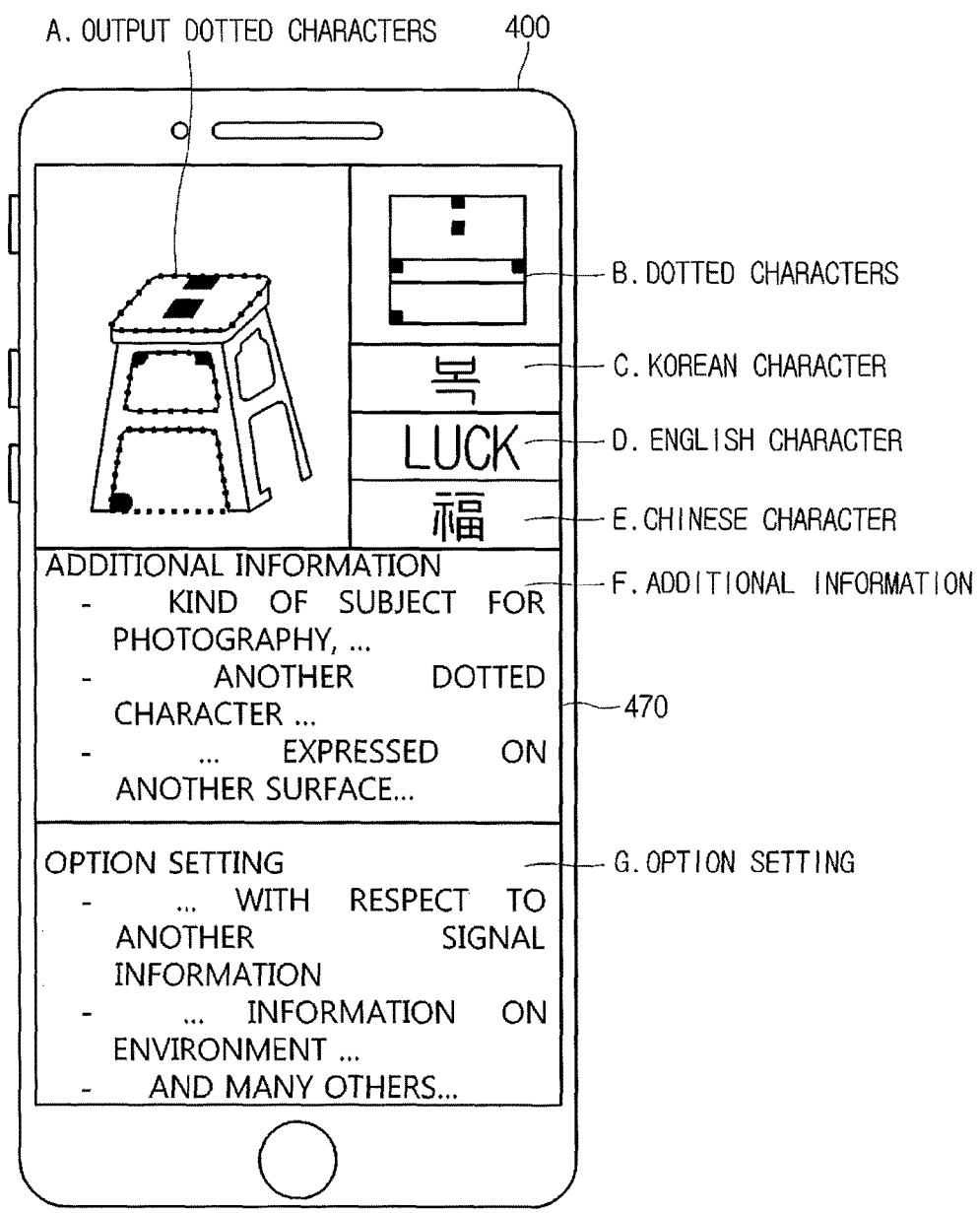
FIG. 23 is a diagram showing the display state of a displaying part of the device for analyzing an object of design as described in FIG. 21.

As shown in FIG. 23, dotted characters B as symbolic signs extracted through FIG. 15 are displayed through the display part 470 of the device 400 for analyzing the object of design and "복" as character information C recognized from the symbolized images, "LUCK" as information D on the character translated in English, and "福" as information E on the character translated in Chinese are displayed with the image of the chair as the object of design in FIG. 15.

Additionally, under the condition that the object of design is displayed in the display part 470 by being shot through a camera module in the device 400 for analyzing the object of design, if the analysis part 450 executes the analysis and the symbolized image or the character image as the result of analysis is displayed by being overlapped with the shot image of the object of design in the display part 470, the user may receive an augmented reality service through the object of design currently being shot.

As the image of the object of design with the symbolized images being overlapped and the original image thereof together are stored in the storage part 430, the user may easily compare and check both.

In the display part 470 of the device 400 for analyzing the object of design, other additional information F and option setting information G could be additionally displayed as well.

Upon the execution of the present invention, information on the appearance of the object of design inputted through the input part 410 of the device 400 for analyzing the object of design could be not only image information of the object of design but also information on temperature by part thereof, information on lighting emitted therefrom, and information on frequency by part thereof.

In other words, the analysis part 450 may extract a symbolized image by analyzing image information on the appearance of the object of design, but if the object of design includes the symbolic sign implemented by using invisible temperature distribution or frequency distribution, the analysis part 450 could execute a visual graphic process of such external temperature distribution information or frequency distribution information of the object of design and extract the symbolized image by analyzing the image of temperature distribution or frequency distribution that is visually and graphically processed.

Upon the execution of the present invention, infrared image information, UV image information, thermal imaging information, sound wave distribution information, information on images of detecting chemical reactions, information on images of detecting electronic signals, etc., as information on the appearance, could be used independently or multiply and the analysis part 450 could extract a symbolized image from the images secured through the visual process regarding the information on the appearance.

In addition, the information on the appearance could be inputted through the input part 410 while images are separated respectively on the upper side, bottom, front, back, and left and right sides of the object of design, but if the information on the appearance is inputted through a camera module with a zooming function, information on the appearance with respect to three sides of the object of design could be inputted at the same time by using the zooming function through the input part 410. In this case, the analysis part 450 could recognize with higher precision by analyzing the image information on the three sides at the same time and extracting the symbolized image.

In addition, the analysis part 450 could perform analysis based on the information on the appearance inputted in consecutive order through the input part 410. After completing the first analysis depending on the information on the appearance primarily inputted, sequential analyses could be performed as well with respect to information on the appearance inputted secondarily through the input part 140.

Furthermore, on the assumption that lights, implemented by individual symbolized images corresponding to information of individual characters "성원에" "감사드립니다 .", are shined in order on the stage of a concert hall, if the stage is decorated with the stage lights implemented by the individual symbolized images with a time lag, the camera module equipped by the device 400 for analyzing the object of design could take consecutive shots of the stage and the analysis part 450 could analyze the stage light images in order. Accordingly, the message through the performance lights, i.e., "성원에" " 감사드립니다 .", could be displayed through the display part 470.

The present invention could be used to analyze the object of design implemented by multiple symbolized images overlapped each other. In other words, as shown in FIG. 24, analysis is possible even at the state that the layout of the symbolic signs and different space divisions is expressed to be overlapped.

Figure 24:
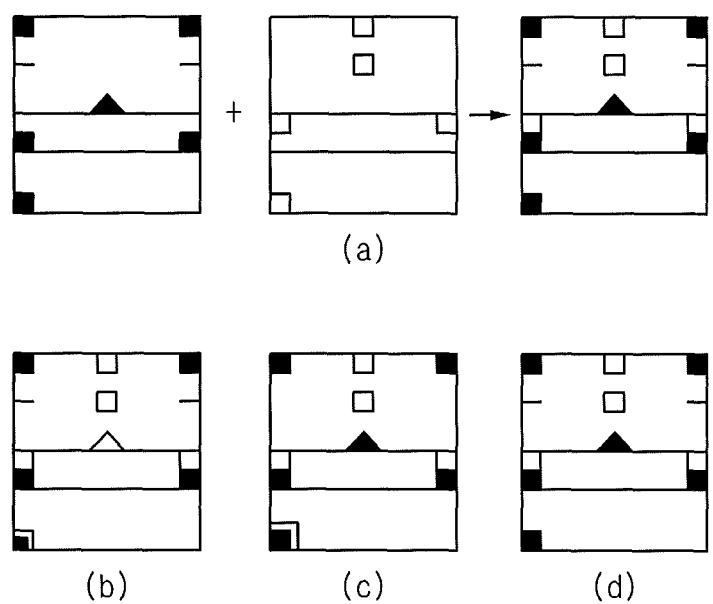
FIG. 24 is a diagram illustrating examples of overlapped characters in accordance with one example embodiment of the present invention.

First of all, to explain the principle of creating the overlapping state of multiple symbolized images, the layout and space division of the complicated symbolic signs could be achieved by overlapping two symbolized images (Layers 1 and 2) as shown in FIG. 24.

Before overlapping the two symbolized images, it is necessary to indicate the symbolic signs for individual characters differently to make them easily identifiable after the two symbolized images are overlapped. At the time, it is possible to distinguish by making shapes, positions, sizes, and transparencies of symbolic signs different or using characters, signs, etc. The easiest method is to divide by colors.

After a character "축" is made in black as shown in the first image of FIG. 24(*a*) and a character "복" is set in grey as shown in the second image thereof, the two symbolized images are overlapped to be expressed as shown in the third image thereof. At the time, because the final consonants of "축" and "복" are "ㄱ" if the shapes and the sizes of the figures are same, the figure (the image of the final consonant) of a second symbolized image (Layer 2) is covered by that of a first symbolized image (Layer 1), at which time, the overlapped state is clearly shown by making the sizes of the figures of the two symbolized images different, e.g., by reducing the size of the figure of the first symbolized image (Layer 1) (the image of the final consonant) or (b) enlarging the size of the second symbolized image (Layer 2) (c).

Besides, if the figure of the second symbolized image is covered by the first symbolized image and it is easily possible to analogize, the indications of the figure of the second symbolized image could be omitted (d).

It is possible to separate individual layers and divide them into each of independent characters by granting unique characteristics to the respective layers to make the two overlapped symbolized images (Layers 1 and 2) discerned. In accordance with one example embodiment, as characteristics granted to the layers, a variety of parameters, such as colors, textures (precisely visions), brightness, chroma, contrast, pattern, and transparency, could be considered. Further, space separation with respect to the two layers could also be made by referring to information on 2D and 3D.

Figure 25:
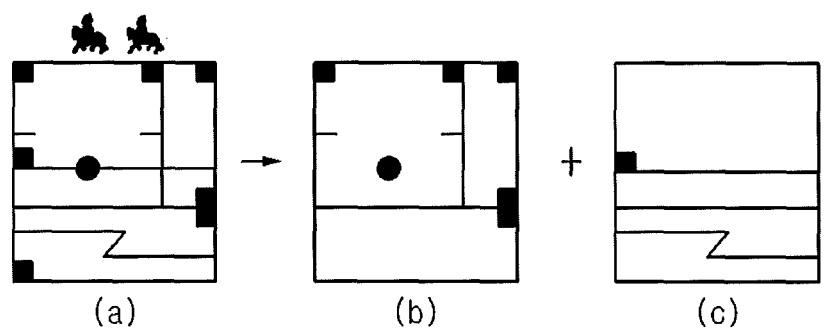
FIGS. 25 and 31 are drawings showing examples of reading overlapped characters in accordance with one example embodiment of the present invention.

For example, as shown in FIG. 25, the order of overlapped layers is indicated with respective identifiers for recognizing respective layers on the top of the overlapped layers. As the purposes of the identifiers are order mark and decorations, it may display the state of the overlapped layers with a number of the identifiers which is same as, or not same as, the number of layers. It is possible to identify the order of layers with the identifiers and the number of layers by the number of types in the overlapped symbolic signs. The order of identifiers is determined to be from "top" to "bottom" if it is displayed vertically and to be from "left" to "right" if it is displayed horizontally depending on how to read characters. Accordingly, the identifier located on the top and the far left displays a first layer.

For example, as shown in the first image of FIG. 25, an identifier (e.g., black identifier) same as one of the color, contrast, brightness, pattern, transparency, and texture of the first symbolized image (Layer 1) created first is displayed first and an identifier (e.g., grey identifier) same as one of the color, contrast, brightness, pattern, transparency, and texture of the second symbolized image (Layer 2) created later is displayed at the rear. In the two symbolized images (Layers 1 and 2) overlapped as shown in the first image (a) of FIG. 25, "한" is first deciphered as shown in the second image (b) thereof and then "글" is decoded later as shown in the third image (c) thereof by referring to the order of the identifiers. Thus, the first image (a) could be made out as "한글."

In short, the device 400 for analyzing the object of design could identify the overlapped symbolized images implemented on the object of design. More specifically, in the two symbolized images (Layers 1 and 2) overlapped as shown in the first image of FIG. 25, the analysis part 450 could first decipher "한" as shown in the second image thereof and then "글" later as shown in the third image thereof by referring to the order of the identifiers to thereby decipher and recognize the first image overlapped as "한글."

Figure 31:
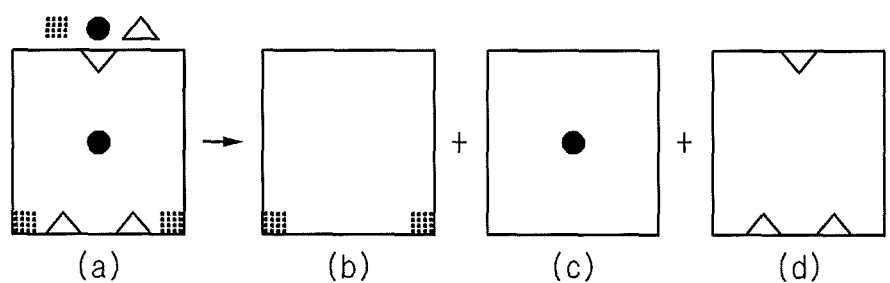

Besides, the principle of deciphering and recognizing the overlapped image explained through FIG. 25 could be applied in the same method even for English characters "TOM" in FIG. 31.

Figure 26:
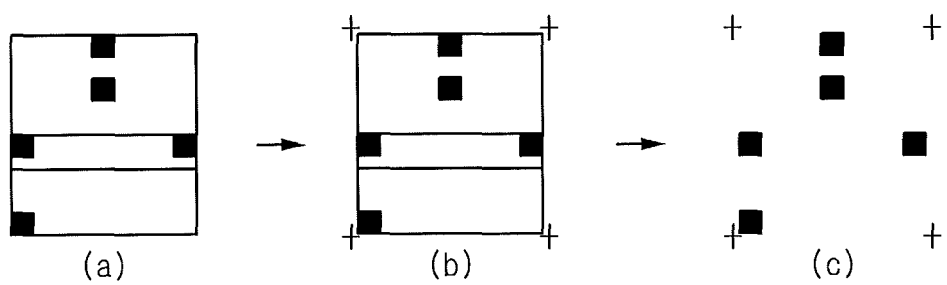
FIGS. 26 and 27 are drawings explaining principles of extracting character information while space division lines of symbolized images are not displayed in accordance with the present invention.

The symbolized image implemented on the object of design in the present invention could be implemented without any space division line as shown in (c) of FIG. 26, in which case, to facilitate the recognition of character information from the symbolized image through the analysis part 450, as shown in FIG. 26, reference coordinates are placed in a form of "+" on four corners of the space division lines and the marks of the reference coordinates could be expressed in another form, added, or omitted, depending on the designer's intention.

Figure 27:
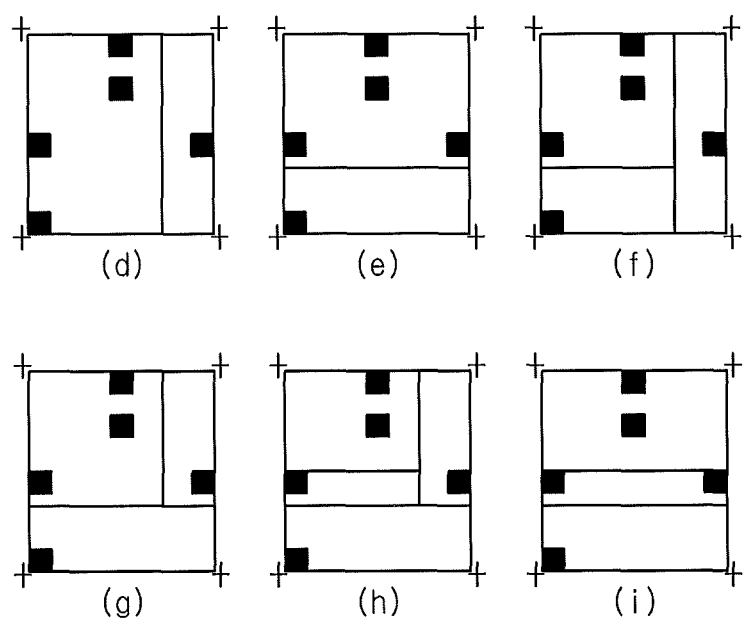

Regarding the input as shown in (c) of FIG. 23, the analysis part 450 could recognize the reference coordinates marked on four corners of the symbolized image and recognize information on characters by referring to a total of six space division lines as illustrated in FIG. 7 which are types of space division lines with reference coordinates functioning as the corners and are applied in order as shown in FIG. 27.

More preferentially, among characters individually recognized depending on the total of six space division lines in order as shown in FIG. 27, only one valid character is "복" which is extracted from (i).

Accordingly, just as shown in (c) of FIG. 26, even if no space division lines of a symbolized image is displayed, the analysis part 450 could recognize information on a character by referring to the symbolized image based on reference coordinates (+).

At the time, if it is possible to recognize character information from the symbolized image without any reference coordinates, such reference coordinates could be omitted and if several symbolized images are arranged at the same time, even though space division lines are not displayed, the character information could be recognized by combining information on the layout and shapes of the symbolized images, at which time, the reference coordinates could be omitted. Being used as reference points for the initial space division lines, the reference coordinates could be displayed by several signs or methods other than a shape of (+).

As seen above, the preferred example embodiments and examples of applications have been illustrated and explained, but the present invention is not limited to the specific example embodiments and examples of applications as mentioned above. Of course, it will be understood by those skilled in the art that various changes and modifications may be made without departing from the spirit and scope of the invention as defined in the following claims and such changes and modifications should not be understood separately from thought of technology or prospects.

Moreover, the terms used in the present invention have been used to explain only specific embodiments and they are not intended to limit the present invention. Unless otherwise clearly meant in the context, any singular expression includes the respective expression as well. In this application, it must be understood that the terms including "include" or "have" are intended to designate that characteristics, numbers, steps, operations, components, parts, or combination of them exist and presence or addition of one or more characteristics, numbers, steps, operations, components, parts or combinations thereof is not precluded.

The industrial applicability of the present invention is accepted in the industrial field regarding design by using computer.

In accordance with the present invention, the device and the method for mapping out design by using symbolized images to make a variety of industrial products such as products, works of art, structures, handcrafts, buildings, etc. are provided.

In accordance with the present invention, the device and the method for analyzing the object of design where symbolized images are applied to recognize the symbolized images implemented in the design of a variety of industrial products such as products, works of art, structures, handcrafts, buildings, etc. and their corresponding character information are also provided.

What is claimed is:

1. A method for outputting a design by using a symbolic image sign corresponding to information on geometry of a character, comprising the steps of:
    (a) acquiring, by a processor, information on the character;
    (b) determining, by the processor, a subject region which encompasses the character by referring to the information on the geometry of the character;
    (c) assigning, by the processor, first metadata to portions within the subject region corresponding to the character, wherein the first metadata has a first color;
    (d) assigning, by the processor, second metadata to portions within the subject region corresponding to a blank space not occupied by the character, wherein the second metadata has a second color;
    (e) reassigning, by the processor, the first metadata to have the second color and the second metadata to have the first color;
    (f) adjusting, by the processor, a ratio of an area of the first metadata to an area of the second metadata while maintaining the information on the geometry of the character by increasing the area of the first metadata within the subject region, wherein the adjusted second metadata correspond to the symbolic sign; and
    (g) outputting, by the processor, the symbolic sign, wherein the symbolic sign represents the information on the character per se.

2. The method of claim 1, wherein the character includes at least one of Korean characters, English characters, and numerals.

3. The method of claim 1, wherein the symbolic sign is determined depending on a shape of the blank space of the character.

4. The method of claim 3, wherein the symbolic sign comprises at least one of triangle, square, circle, or any other shapes.

5. The method of claim 1, wherein, at the step of (a), a structure of an object of design is designed depending on the shape of the symbolic sign.

6. The method of claim 1, wherein, at the step of (a), wherein an external surface of an object of design is designed depending on a shape of the symbolic sign.

7. A device for mapping out a design by using a symbolized image, comprising:
    a design processing part of a processor for (a) acquiring information on the character, (b) determining a subject region which encompasses the character by referring to the information on the geometry of the character, (c) assigning first metadata to portions within the subject region corresponding to the character, wherein the first metadata has a first color, (d) assigning second metadata to portions within the subject region corresponding to a blank space not occupied by the character, wherein the second metadata has a second color, (e) reassigning the first metadata to have the second color and the second metadata to have the first color, (f) adjusting a ratio of an area of the first metadata to an area of the second metadata while maintaining the information on the geometry of the character by increasing the area of the first metadata within the subject region, wherein the adjusted second metadata correspond to the symbolic sign, wherein the symbolic sign represents the information on the character per se; and
    an output part of the processor for outputting an image of the symbolic sign by the design processing part.

8. The device of claim 7, wherein the character includes at least one of Korean characters, English characters, and numerals.

9. The device of claim 7, wherein the symbolic sign is determined depending on a shape of the blank space of the character.

10. The device of claim 9, wherein the symbolic sign comprises at least one of triangle, square, circle, or any other shapes.

11. The device of claim 7, wherein the design processing part designs a structure of an object of design depending on the shape of the symbolic sign.

12. The device of claim 7, wherein the design processing part designs an external surface of an object of design depending on a shape of the symbolic sign.

13. A method for analyzing an object of design to which a symbolized image is applied, comprising the steps of:
    (a) receiving, by a processor, information on an appearance of the object of design implemented by using a symbolized image including a symbolic sign having first metadata and second metadata within a subject region encompassing the symbolic sign, wherein the first metadata corresponds to portions within the subject region corresponding to the symbolic sign, and wherein the second metadata corresponds to portions within the subject region corresponding to a blank space not occupied by the symbolic sign;
    (b) extracting, by the processor, the symbolized image implemented on the object of design by analyzing the information on the appearance of the object of design and by adjusting a ratio of an area of the first metadata to an area of the second metadata while maintaining information on the appearance of the object of design by decreasing the area of the second metadata within the subject region; and
    (c) displaying, by the processor, the extracted symbolized image.

14. The method of claim 13, wherein the symbolized image is an overlapped image of multiple symbolic signs and, at the step of (b), the multiple symbolic signs are extracted.

15. The method of claim 13, wherein reference coordinates for interpreting the symbolized image is displayed on the symbolized image.

16. The method of claim 13, wherein the character includes at least one of Korean characters, English characters, and numerals.

17. The method of claim 13, wherein the symbolic sign is determined depending on a shape of the blank space of the character images.

18. The method of claim 17, wherein the symbolic sign comprises at least one of triangle, square, circle, or any other shapes.

19. The method of claim 13, wherein the information on the appearance is one piece information among image information, lighting information, temperature information, and frequency information of the object of design.

20. A device for analyzing an object of design to which a symbolized image is applied, comprising:

an input part of a processor for receiving information on the appearance the object of design implemented by using a symbolized image including a symbolic sign having first metadata and second metadata within a subject region encompassing the symbolic sign, wherein the first metadata corresponds to portions within the subject region corresponding to the symbolic sign, and wherein the second metadata corresponds to portions within the subject region corresponding to a blank space not occupied by the symbolic sign;

an analysis part of the processor for extracting the symbolized image implemented on the object of design by analyzing the information on the appearance inputted through the input part and by adjusting a ratio of an area of the first metadata to an area of the second metadata while maintaining information on the appearance of the object of design by decreasing the area of the second metadata within the subject region; and a display part of the processor for displaying the symbolized image extracted by the analysis part.

21. The device of claim 20, wherein the symbolized image is an overlapped image of multiple symbolic signs and the analysis part extracts the multiple symbolic signs.

22. The device of claim 20, wherein reference coordinates for interpreting the symbolized image is displayed on the symbolized image.

23. The device of claim 20, wherein the character includes at least one of Korean characters, English characters, and numerals.

24. The device of claim 20, wherein the symbolic sign is determined depending on the shape of the blank space of the character.

25. The device of claim 24, wherein the symbolic sign comprises at least one of triangle, square, circle, or any other shapes.

26. The device of claim 20, wherein the information on the appearance is one piece information among image information, lighting information, temperature information, and frequency information of the object of design.

* * * * *